US006916543B2

United States Patent
De et al.

(10) Patent No.: US 6,916,543 B2
(45) Date of Patent: Jul. 12, 2005

(54) COPOLYMER, PHOTORESIST COMPOSITIONS THEREOF AND DEEP UV BILAYER SYSTEM THEREOF

(75) Inventors: Binod B. De, Providence, RI (US); Sanjay Malik, Attleboro, MA (US); Stephanie J. Dilocker, East Providence, RI (US); Ognian N. Dimov, Cranston, RI (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 10/699,298

(22) Filed: Oct. 31, 2003

(65) Prior Publication Data
US 2004/0137362 A1 Jul. 15, 2004

Related U.S. Application Data

(60) Provisional application No. 60/422,781, filed on Oct. 31, 2002.

(51) Int. Cl.$^7$ .................................................. B32B 9/04
(52) U.S. Cl. ................ 428/447; 430/287.1; 430/270.1; 430/286.1; 430/311; 526/321; 526/328.5; 526/347; 526/268; 526/279; 528/26; 528/32; 528/41
(58) Field of Search ....................... 428/447; 430/287.1, 430/270.1, 286.1, 311, 322; 526/321, 328.5, 347, 268, 279; 528/26, 32, 41

(56) References Cited

U.S. PATENT DOCUMENTS

| | | | |
|---|---|---|---|
| 5,484,867 A | 1/1996 | Lichtenhan et al. | |
| 6,420,084 B1 | 7/2002 | Angelopoulos et al. | |
| 6,664,024 B1 | 12/2003 | Nguyen et al. | 430/280.1 |
| 2002/0013059 A1 | 1/2002 | Kishimura et al. | 438/694 |
| 2002/0128414 A1 | 9/2002 | James, Jr. et al. | 526/279 |
| 2002/0182541 A1 | 12/2002 | Gonsalves | 430/287.1 |
| 2004/0068075 A1 | 4/2004 | Lichtenhan et al. | 528/15 |

OTHER PUBLICATIONS

Feher et al., "*Facile Syntheses of New Incompletely Condensed Polyhedral Oligosilsesquioxane [c-($C_5H_9$)$_7SI_7O_9$-($OH$)$_3$], [c-$C_7H_{13}$)$_7SI_7O_9$($OH$)$_3$], and [c-$C_7H_{13}$)$_6O_7$-($OH$)$_4$]*", Organometallics, 1991, pp. 2526-2528.

Joseph C. Salamone, "*Silsesquioxane–Based Polymers*", Polymeric Materials Encyclopedia vol. 10, Q–S, 1996, pp. 7768–7778.

Lichtenhan et al., "*Linear Hybrid Polymer Building Blocks: Methacrylate–Functionalized Polyhedral Oligomeric Silsesquioxane Monomers and Polymers*", Macromolecules 1995, pp. 8435–8437.

Lichtenhan et al. "*Nanostructured chemicals: A new era in chemical technology*", Chemical Innovation, Jan. 2001, vol. 31, No. 1 pp. 1–5.

Joseph D. Lichtenhan, "*Polyhedral Oligomeric Silsesquioxnes: Building Blocks for Silsesquioxane–Based Polymers and Hybrid Materials*", Inorg. Chem. vol. 17, No. 2, 1994, pp. 115–130.

Wu et al., "*Novel Positive–Tone Chemically Amplified Resists with Photoacid Generator in the Polymer Chains*", Adv. Mater., 13, No. 9 May 2001, pp. 670–672.

Wu et al., "*Incorporation of polyhedral oligosilsesquioxane in chemically amplified resists to improve their reative ion etching resistance*", J. Vac. Sci. Techno. B 19 (3), May/Jun. 2001, pp. 851–855.

Gonsalves et al., "*Organic–Inorganic Nanocomposites: Unique Resists for Nanolithography*", Adv. Mater. 2001, 13, No> 10, May 17, 2001, pp. 703–714.

International Search Report Application No. PCT/US03/34832 dated Apr. 29, 2004.

Primary Examiner—David J. Buttner
Assistant Examiner—Christopher Keehan
(74) Attorney, Agent, or Firm—Ohlandt, Greeley, Ruggiero & Perle LLP

(57) ABSTRACT

Novel copolymers suitable for forming the top layer photoimagable coating in a deep U V. particularly a 193 nm and 248 nm, bilayer resist system providing high resolution photolithography. Chemically amplified photoresist composition and organosilicon moieties suitable for use in the binder resin for photoimagable etching resistant photoresist composition that is suitable as a material for use in ArF and KrF photolithography using the novel copolymers.

68 Claims, No Drawings

COPOLYMER, PHOTORESIST COMPOSITIONS THEREOF AND DEEP UV BILAYER SYSTEM THEREOF

RELATED APPLICATION

This application claims the priority, under 35 U.S.C. 119, of U.S. Provisional Application No. 60/422,781, filed Oct. 31, 2002.

BACKGROUND OF THE INVENTION

New, improved, advanced resists are required to manufacture new electronic devices with smaller feature sizes. Typically, improvements are required in photoresist resolution, photospeed, depth of focus, and other properties. Resolution improvements can also be obtained via exposure systems utilizing higher numerical apertures. Unfortunately, as the resolution is improved via higher numerical apertures, the depth of focus at best resolution usually decreases due to optical effects. Thus, improvements in depth of focus of resist are also desirable.

The most common type of resists are called "single layer" resists in which the resist has both the function of imaging and plasma etch resistance. A second type of resist is termed a "bilayer resist" in which the top layer is assigned the function of imaging and the underlayer assigned the function of plasma etch resistance. An oxygen etch step transfers the imaged pattern into the underlayer. Bilayer resists typically contain silicon and provide certain advantages in resolution from using thinner imaging films and in many cases the bilayer resist/undercoat combination provide better substrate plasma etch resistance. Examples of bilayer resists can be found for example in U.S. Pat. No. 6,359,078, U.S. Pat. No. 5,985,524 and U.S. Pat. No. 6,028,154 and other patents, each of which is incorporated herein in their entirety.

Photoresists based on silsesquioxane polymers as the polymeric backbone have been reported in U.S. Pat. No. 6,420,084 and other patents. Polyhedral oligomeric silsesquioxanes are characterized by low molecular weight and closed or partially open cage structures having specific numbers of silicon atoms at the vertices of the cage. Polyhedral oligomeric silsesquioxanes when incorporated into polymers are typically pendant from the polymer chain rather than forming the polymer backbone and have a lower concentration relative to typical silsesquioxane polymers. There are few reports of photosensitive compositions containing polyhedral oligomeric silsesquioxanes (POSS®) in which the polyhedral oligomeric silsesquioxane is pendant from the polymer backbone (see U.S. patent application Ser. No. 09/992,560, published as US 2002/0182541 A1).

SUMMARY OF THE INVENTION

The present invention provides novel copolymers suitable for forming the top layer photoimagable coating in a deep UV, particularly a 193 nm and 248 nm, bilayer resist system providing high resolution photolithography. The invention also provides a chemically amplified photoresist composition and organosilicon moieties suitable for use in the binder resin for photoimagable etching resistant photoresist composition that is suitable as a material for use in ArF and KrF photolithography.

The present invention provides, in an aspect, a novel copolymer comprising: at least one Structure (I) first repeating unit comprising one or more repeating units represented by Structure (IA) or Structure (IB) or Structure (IC)

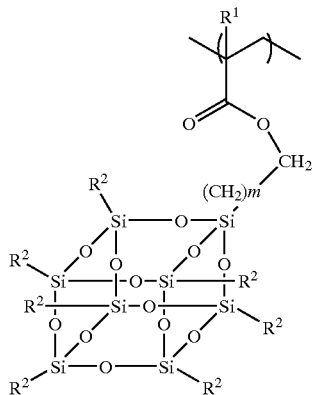

Structure (IA)

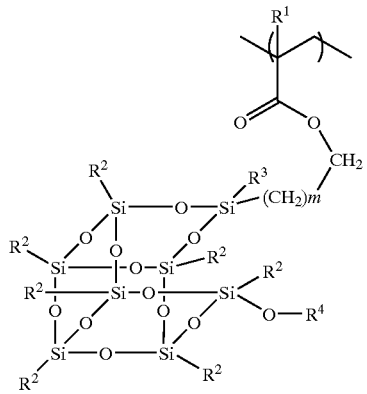

Structure (IB)

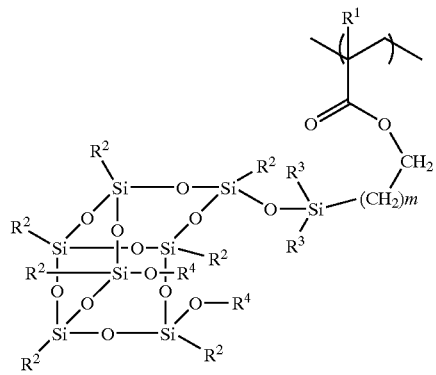

Structure (IC)

wherein each $R^1$ is independently a hydrogen atom or a methyl group; each $R^3$ is independently a linear, branched or cyclic alkyl or an alicyclic group having 1 to 20 carbon atoms; m is an integer of from about 2 to about 10; each $R^4$ can independently be H or Structure (II),

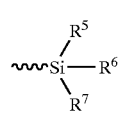

Structure (II)

wherein $R^5$, $R^5$ and $R^7$ are independently a linear, branched and cyclic alkyl or a linear, branched or, cyclic and alicyclic fluoroalkyl or a substituted or substituted alicylic group having 1 to 20 carbon atoms; and each $R^2$ can independently be:

(1) a linear, branched or cyclic alkyl or an unsubstituted or substituted alicyclic group, having 1 to 20 carbon atoms;

(2) a linear, branched or cyclic fluoroalkyl or fluorine substituted alicyclic group having 1 to 20 carbon atoms; and (3) a polar group, such as
    (a) $(CH_2)_n$—$OR^8$, where n is an integer of from about 2 to about 10 and $R^8$ can be H, an $R^3$ group or an α-alkoxy alkyl group; and $R^3$ is a linear, branched and cyclic alkyl or alicyclic group having 1 to 20 carbon atoms;
    (b) $(CH_2)_n$—(C=O)—$OR^9$, where n is an integer of from about 2 to about 10 and $R^9$ can be H, an $R^3$ group or an acid sensitive protecting group; and $R^3$ is a linear, branched and cyclic alkyl or alicyclic group having 1 to 20 carbon atoms;
    (c) $(CH_2)_n$—$C(CF_3)R^{10}$—$OR^{11}$, where n is an integer of from about 2 to about 10 and $R^{10}$ can be H or fluoromethyl, difluoromethyl or trifluoromethyl and $R^{11}$ can be H or an $R^3$ alkyl group; and
    (d) $(CH_2)_n$—O—(C=O)$R^3$, where n is an integer of from about 2 to about 10; and $R^3$ is a linear, branched and cyclic alkyl or alicyclic group having 1 to 20 carbon atoms;

and a second repeating unit represented by Structure (III),

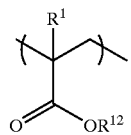

Structure (III)

wherein $R^1$ has the same meaning as defined above and $R^{12}$ is an acid labile group, with the proviso that when Structure (IA) is present in the copolymer and $R^{12}$ is t-Bu, an additional repeating unit having Structure (IV), or Structure (VI), or a repeating unit derived from a ethylenically unsaturated, polymerizable silicon compound different from Structures (IA), (IB), and (IC), as defined hereinafter, must be present.

In another embodiment, the novel copolymer comprises repeating units of Structures (I), (III), and (IV),

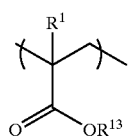

Structure (IV)

wherein $R^1$ has the same meaning as defined above and $R^{13}$ is selected from the following structures (Va–Vg).

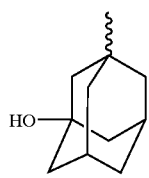

(Va)

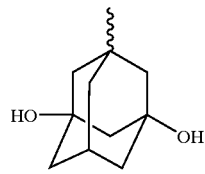

(Vb)

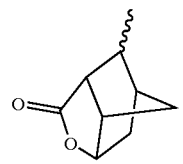

(Vc)

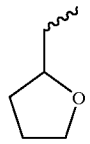

(Vd)

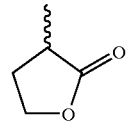

(Ve)

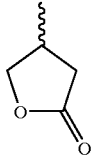

(Vf)

(Vg)

In another embodiment, the novel copolymer comprises repeating units of Structures (I), (III), (IV), and an unprotected alkali solubilizing moiety.

In yet another embodiment, the novel copolymer comprises repeating units of Structures (I), (III), and (VI) wherein $R^1$ has the same meaning as defined above.

Structure (VI)

In another embodiment, the novel copolymer comprises repeating units of Structures (I), (III), and a repeating unit derived from a ethylenically unsaturated, polymerizable silicon compound different from Structures (IA), (IB), and (IC).

In another embodiment, the novel copolymer comprises repeating units of Structures (I), (III), (VI), and a repeating unit derived from a ethylenically unsaturated, polymerizable silicon compound different from Structures (IA), (IB), and (IC).

In another aspect, the present invention provides a chemically amplified positive resist composition comprising an above-described copolymer, a photoacid generator, an organic solvent and basic compound.

DETAILED DESCRIPTION OF THE INVENTION

The components for use in the present invention are described in detail below.

The novel copolymer of the invention is a polymer comprising a at least one first Structure (I) comprising one or more repeating units represented by Structure (IA) or Structure (IB) or Structure (IC),

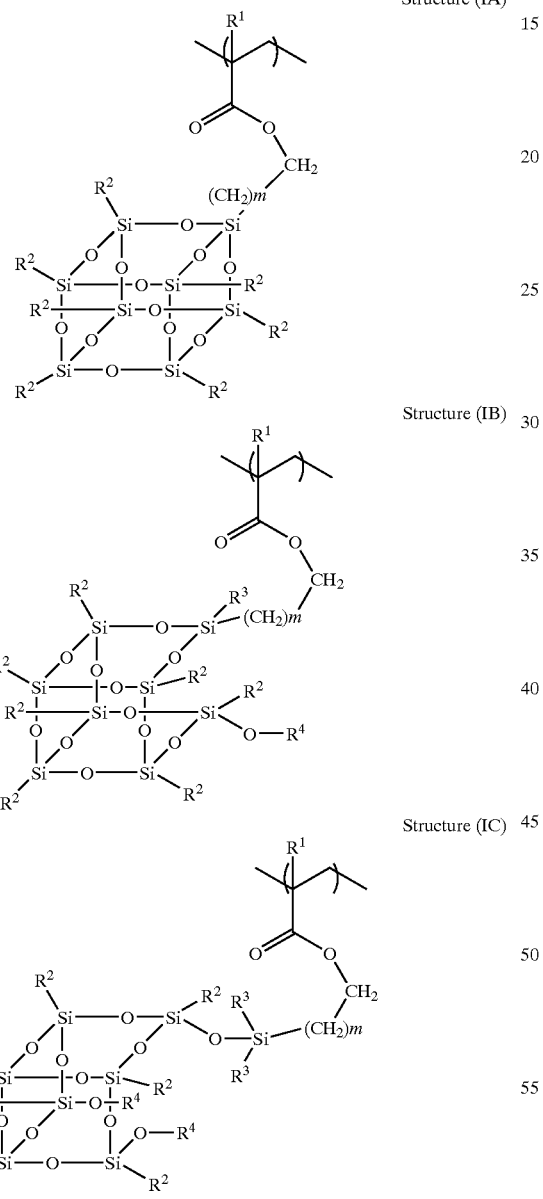

Structure (IA)

Structure (IB)

Structure (IC)

wherein each $R^1$ is independently a hydrogen atom or a methyl group; each $R^3$ is independently a linear, branched or cyclic alkyl or an alicyclic group having 1 to 20 carbon atoms; m is an integer of from about 2 to about 10; each $R^4$ can independently be H or Structure (II),

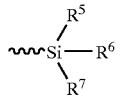

Structure (II)

wherein $R^5$, $R^6$ and $R^7$ are independently a linear, branched and cyclic alkyl or a linear, branched or, cyclic and alicyclic fluoroalkyl or a substituted or substituted alicylic group having 1 to 20 carbon atoms; and each $R^2$ can independently be:

(1) a linear, branched or cyclic alkyl or an unsubstituted or substituted alicyclic group, having 1 to 20 carbon atoms;

(2) a linear, branched or cyclic fluoroalkyl or fluorine substituted alicyclic group having 1 to 20 carbon atoms; and (3) a polar group, such as
   (a) $(CH_2)_n$—$OR^8$, where n is an integer of from about 2 to about 10 and $R^8$ can be H, an $R^3$ group or an α-alkoxy alkyl group; and $R^3$ is a linear, branched and cyclic alkyl or alicyclic group having 1 to 20 carbon atoms;
   (b) $(CH_2)_n$—$(C=O)$—$OR^9$, where n is an integer of from about 2 to about 10 and $R^9$ can be H, an $R^3$ group or an acid sensitive protecting group; and $R^3$ is a linear, branched and cyclic alkyl or alicyclic group having 1 to 20 carbon atoms;
   (c) $(CH_2)_n$—$C(CF_3)R^{10}$—$OR^{11}$, where is an integer of from about 2 to about 10 and $R^{10}$ can be H or fluoromethyl, difluoromethyl or trifluoromethyl and $R^{11}$ can be H or an $R^3$ alkyl group; and
   (d) $(CH_2)_n$—O—$(C=O)R^3$, where is an integer of from about 2 to about 10; and $R^3$ is a linear, branched and cyclic alkyl or alicyclic group having 1 to 20 carbon atoms;

and a second repeating unit represented by Structure (III),

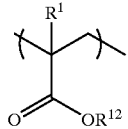

Structure (III)

wherein $R^1$ has the same meaning as defined above and $R^{12}$ is an acid labile group, which is defined above in the case of acid sensitive $R^9$ group with the proviso that when Structure (IA) is present in the copolymer and $R^{12}$ is t-Bu, an additional repeating unit having Structure (IV), or Structure (VI), or a repeating unit derived from an ethylenically unsaturated, polymerizable silicon compound different from Structures (IA), (IB), and (IC), as defined hereinafter, must be present.

Suitable examples of $R^3$ include but are not limited to methyl, ethyl, propyl, isopropyl, n-butyl, sec-butyl, tert-butyl, cyclohexyl, cyclopentyl, octyl, cyclooctyl, cyclononyl, cyclodecyl, norbornyl, isobornyl, adamantyl, adamantylmethylene, tricyclo[5,2,1,0$^{2,6}$]decanemethylene, tetracyclo[4,4,0,1$^{2,5}$,1$^{7,10}$]dodecanyl and the like.

Suitable examples of $R^5$, $R^6$ and $R^7$ include but are not limited to methyl, ethyl, propyl, isopropyl, n-butyl, sec-butyl, tert-butyl, cyclohexyl, cyclopentyl, octyl, cyclooctyl, cyclononanyl, cyclodecanyl, norbornanyl, isobornanyl, adamantyl, adamantylmethylene, tricyclo[5,2,1,0$^{2,6}$] decanemethylene, tetracyclo[4,4,0,1$^{2,5}$,1$^{7,10}$]dodecanyl, trifluoromethyl, 2,2,2-trifluoroethyl, pentafluoroethyl, 3,3,3-trifluoropropyl, 1,1,1,3,3,3-hexafluoroisopropyl, 3,3,3,4,4,4-hexafluorobutyl, 3,3,3,4,4,4,5,5,5-nonafluoropentyl, 3,3,3,4,4,4,5,5,5,6,6,6-dodecafluorohexyl, 3,3,3,4,4,4,5,5,5,6,6,6,7,7,7-pentadedecafluoroheptyl 3,3,3,4,4,4,5,5,5,6,6,6,7,7,7,8,8,8-octadecafluorooctyl and the like.

Examples of Structure (II) include but are not limited to trimethylsilyl, ethyl dimethylsilyl, dimethylpropylsilyl, methylethylpropylsilyl, diethylpropylsilyl, diethylmethylsilyl, dibutylmethylsilyl, tert-butyidimethylsilyl, tert-butyldiethylsilyl, cyclohexyldimethylsilyl, cyclopentyldimethylsilyl, octyldimethylsilyl, cyclooctyldimethylsilyl, cyclononyldimethylsilyl, cyclodecyldimethylsilyl, norbornyldimethylsilyl, isobornyldimethylsilyl, adamantyldimethylsilyl, adamantylmethylenedimethylsilyl, 2-(bicyclo[2.2.1]heptyl)dimethylsilyl tricyclo[5,2,1,0$^{2,6}$]decanemethylenedimethylsilyl, tetracyclo[4,4,0,1$^{2,5}$,1$^{7,10}$]dodecyidimethylsilyl dimethyl-3,3,3-trifluoropropylsilyl, dimethyl-1,1,1,3,3,3-hexafluoroisopropylsilyl, dimethyl-3,3,3,4,4,4-hexafluorobutylsilyl, dimethyl-3,3,3,4,4,4,5,5,5-nonafluoropentylsilyl, dimethyl-3,3,3,4,4,4,5,5,5-nonafluoropentylsilyl, dimethyl-3,3,3-trifluoropropylsilyl, dimethyl-3,3,3,4,4,4,5,5,5,6,6,6-dodecafluorohexylsilyl, dimethyl-3,3,3,4,4,4,5,5,5,6,6,6,7,7,7-pentadedecafluoroheptylsilyl, dimethyl-3,3,3,4,4,4,5,5,5,6,6,6,7,7,7,8,8,8-octadecafluorooctylsilyl and the like.

Each $R^2$ can independently be a linear, branched or cyclic alkyl, or a substituted or unsubstituted alicyclic group having 1 to 20 carbon atoms. The alicyclic moiety may be substituted by one or more substituents at any open valence. Examples of suitable substituents on the alicyclic moiety include linear, branched or cyclic alkyl groups, hydroxyl groups, and hydroxyalkyl groups such as Structure (VII) and ester groups such as Structure (VIII)

Structure (VII)

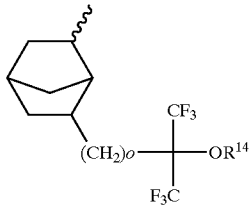

Structure (VIII)

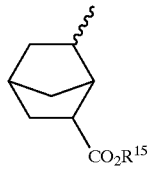

where $R^{14}$ is selected from hydrogen, a linear, branched or cyclic alkyl or alicyclic group having from 1 to 20 carbon atoms, o is an integer from about 1 to about 10; $R^{15}$ is selected from hydrogen, a linear, branched or cyclic alkyl or alicyclic group having from 1 to 20 carbon atoms, and an acid labile group.

Examples of $R^2$ include but are not limited to methyl, ethyl, propyl, isopropyl, n-butyl, sec-butyl, tert-butyl, cyclohexyl, cyclopentyl, cycloheptyl, octyl, cyclooctyl, cyclononyl, cyclodecyl, norbornyl, isobornyl, adamantyl, adamantylmethylene, tricyclo[5,2,1,0$^{2,6}$]decanemethylene, tetracyclo[4,4,0,1$^{2,5}$,1$^{7,10}$]dodecyl and the like. The substituted alicyclic group can be Structure (VII), wherein $R^{14}$ can be hydrogen or a linear, branched or cyclic alkyl and alicyclic group having 1 to 20 carbon atoms and o is an integer from about 1 to about 10. Suitable examples of $R^{14}$ include but are not limited to methyl, ethyl, propyl, isopropyl, n-butyl, sec-butyl, tert-butyl, cyclohexyl, cyclopentyl, octyl, cyclooctyl, cyclononyl, cyclodecyl, norbornyl, isobornyl, adamantyl, adamantylmethylene, tricyclo[5,2,1,0$^{2,5}$]decanemethylene, tetracyclo[4,4,0,1$^{2,5}$, 1$^{7,10}$]dodecyl and the like.

Examples of Structure (VII) include but are not limited to 5-bicyclo[2.2.1]heptyl-2-(11,11-trifluoro-2-trifluoromethyl)propan-2-ol, 5-bicyclo[2.2.1]heptyl-2-(11,1-trifluoro-2-trifluoromethyl)butyl-2-ol, 5-bicyclo[2.2.1]heptyl-2-(1,1,1-trifluoro-2-trifluoromethyl)propyl-2-oxomethyl, 5-bicyclo[2.2.1]heptyl-2-(1,1,1-trifluoro-2-trifluoromethyl)propyl-2-oxoethyl, 5-bicyclo[2.2.1]heptyl-2-(1,1,1-trifluoro-2-trifluoromethyl)propyl-2-oxopropyl, 5-bicyclo[2.2.1]heptyl-2-(1,1,1-trifluoro-2-trifluoromethyl)propyl-2-oxo-n-butyl, 5-bicyclo[2.2.1]heptyl-2-(1,1,1-trifluoro-2-trifluoromethyl)propyl-2-oxo-tertbutyl, 5-bicyclo[2.2.1]heptyl-2-(1,1,1-trifluoro-2-trifluoromethyl)propyl-2-oxocyclohexyl, 5-bicyclo[2.2.1]heptyl-2-(1,1-trifluoro-2-trifluoromethyl)propyl-2-oxooctyl, 5-bicyclo[2.2.1]heptyl-2-(1,1,1-trifluoro-2-trifluoromethyl)propyl-2-oxocyclooctyl, 5-bicyclo[2.2.1]heptyl-2-(1,1,1-trifluoro-2-trifluoromethyl)propyl-2-oxocyclononyl, 5-bicyclo[2.2.1]heptyl-2-(1,1,1-trifluoro-2-trifluoromethyl)propyl-2-oxocyclodecyl, 5-bicyclo[2.2.1]heptyl-2-(1,1,1-trifluoro-2-trifluoromethyl)propyl-2-oxonorbornyl 1, 5-bicyclo[2.2.1]heptyl-2-(1,1,1-trifluoro-2-trifluoromethyl)propyl-2-oxoisobornyl, 5-bicyclo[2.2.1]heptyl-2-(1,1,1-trifluoro-2-trifluoromethyl)propyl-2-oxoadamantyl, 5-bicyclo[2.2.1]heptyl-2-(1,1,1-trifluoro-2-trifluoromethyl)propyl-2-oxo adamantylmethylene, 5-bicyclo[2.2.1]heptyl-2-(1,1,1-trifluoro-2-trifluoromethyl)propyl-2-oxotricyclo[5,2,1,0$^{2,6}$]decanemethylene, bicyclo[2.2.1]heptyl-2-(1,1,1-trifluoro-2-trifluoromethyl) propyl-2-oxotetracyclo[4,4,0,1$^{2,5}$,1$^{7,10}$]dodecyl and the like.

$R^2$ can be Structure (VIII), wherein $R^{15}$ can be hydrogen or a linear, branched and cyclic alkyl or alicyclic group having 1 to 20 carbon atoms or an acid sensitive group. Suitable examples of $R^{15}$ include but are not limited to methyl, ethyl, propyl, isopropyl, n-butyl, sec-butyl, tert-butyl, cyclohexyl, cyclopentyl, octyl, cyclooctyl, cyclononyl, cyclodecyl, norbornyl, isobornyl, adamantyl, adamantylmethylene, tricyclo[5,2,1,0$^{2,6}$]decanemethylene, tetracyclo[4,4,0,1$^{2,5}$,1$^{7,10}$]dodecyl and the like. The acid labile protecting group in $R^{15}$ may be selected from the group consisting of tert-butyl group, 1,1-dimethylpropyl group, 1-methyl-1-ethylpropyl group, 1,1-diethylpropyl group, 1,1-dimethylbutyl group, 1-methyl-1-ethylbutyl group, 1,1-diethyl butyl group, 1,1-dimethylpentyl group, 1-methyl-1-ethylpentyl group, 1,1-diethylpentyl group, 1,1-dimethylhexyl group, 1-methyl-1-ethylhexyl group, 1,1-diethylhexyl group and the like, 1-methyl-1-cyclopentyl, 1-ethyl-1-cyclopentyl, 1-propyl-1-cyclopentyl, 1-butyl-1-cyclopentyl, 1-methyl-1-cyclohexyl, 1-ethyl-1-cyclohexyl, 1-propyl-1-cyclohexyl, 1-butyl-1-cyclohexyl, 2-methyl-2-adamantyl, 2-ethyl-2-adamantyl, 2-propyl-2-adamantyl, 2-butyl-2-adamantyl, and 2-isopropyl-2-adamantyl and 1,1-dimethyl-3-oxobutyl, 1-ethyl-1-methyl-3-oxobutyl, 1-methyl-1-cyclohexyl-3-oxobutyl, 1,1-dimethyl-3-oxopentyl, tetrahydropyran-2-yl and the like. The examples of Structure (VIIII) include but are not limited to 5-(methoxycarbonyl-2-bicyclo[2.2.1]heptyl), 5-(ethoxycarbonyl-2-bicyclo[2.2.1]heptyl), 5-(propyloxycarbonyl-2-bicyclo[2.2.1]heptyl), 5-(n-butoxy carbonyl-2-bicyclo[2.2.1]heptyl), 5-(sec-butoxycarbonyl-2-bicyclo[2.2.1]heptyl), 5-(tert-butoxycarbonyl-2-bicyclo[2.2.1]heptyl), 5-(cyclohexyloxycarbonyl-2-bicyclo[2.2.1]heptyl), 5-(cyclopentyloxycarbonyl-2-bicyclo[2.2.1]heptyl), 5-(octyloxycarbonyl-2-bicyclo[2.2.1]heptyl), 5-(cyclooctyloxycarbonyl-2-bicyclo[2.2.1]heptyl), 5-(cyclononyloxycarbonyl-2-bicyclo[2.2.1]heptyl), 5-(cyclodecyloxycarbonyl-2-bicyclo[2.2.1]heptyl), 5-(norbornyloxycarbonyl-2-bicyclo[2.2.1]heptyl), 5-(isobornyloxycarbonyl-2-bicyclo[2.2.1]heptyl), 5-(adamantyloxycarbonyl-2-bicyclo[2.2.1]heptyl), 5-(adamantylmethyleneloxycarbonyl-2-bicyclo[2.2.1]heptyl), 5-(tricyclo[5,2,1,0$^{2,6}$]decanemethyleneloxycarbonyl-2-bicyclo[2.2.1]heptyl), 5-(tetracyclo[4,4,0,1$^{2,5}$,1$^{7,10}$]dodecyloxycarbonyl-2-bicyclo[2.2.1]heptyl), 5-(1,1-dimethylpropyloxycarbonyl-2-bicyclo[2.2.1]heptyl), 5-(1-methyl-1-ethylpropyloxycarbonyl-2-bicyclo[2.2.1]heptyl), 5-(1,1-diethylpropyloxycarbonyl-2-bicyclo[2.2.1]heptyl), 5-(1,1-dimethylbutyloxycarbonyl-2-bicyclo[2.2.1]heptyl), 5-(1-methyl-1-ethylbutyloxycarbonyl-2-bicyclo[2.2.1]heptyl), 5-(1,1-diethyl butyloxycarbonyl-2-bicyclo[2.2.1]heptyl), 5-(1,1-dimethylpentyloxycarbonyl-2-bicyclo[2.2.1]heptyl), 5-(1-methyl-1-ethylpentyloxycarbonyl-2-bicyclo[2.2.1]heptyl), 5-(1,1-diethylpentyloxycarbonyl-2-bicyclo[2.2.1]heptyl), 5-(,1-dimethylhexyloxycarbonyl-2-bicyclo[2.2.1]heptyl), 5-(1-methyl-1-ethyl hexyloxycarbonyl-2-bicyclo[2.2.1]heptyl), 5-(1,1-diethylhexyloxycarbonyl-2-bicyclo[2.2.1]heptyl), 5(1-methyl-1-cyclohexyloxy oxycarbonyl-2-bicyclo[2.2.1]heptyl), 5-(1-ethyl-1-cyclohexyloxycarbonyl-2-bicyclo[2.2.1]heptyl), 5-(1-propyl-1-cyclohexyloxycarbonyl-2-bicyclo[2.2.1]heptyl), 5-(1-butyl-1-cyclohexyloxycarbonyl-2-bicyclo[2.2.1]heptyl), 5-(2-methyl-2-adamantyl oxycarbonyl-2-bicyclo[2.2.1]heptyl), 5-(2-ethyl-2-adamantyloxycarbonyl-2-bicyclo[2.2.1]heptyl), 5-(2-propyl-2-adamantyloxycarbonyl-2-bicyclo[2.2.1]heptyl), 5-(2-butyl-2-adamantyloxycarbonyl-2-bicyclo[2.2.1]heptyl), 5-(2-isopropyl-2-adamantyl oxycarbonyl-2-bicyclo[2.2.1]heptyl), 5-(1,1-dimethyl-3-oxobutyloxycarbonyl-2-bicyclo[2.2.1]heptyl), 5-(1-ethyl-1-methyl-3-oxobutyloxycarbonyl-2-bicyclo[2.2.1]heptyl), 5-(1-methyl-1-cyclohexyl-3-oxobutyloxycarbonyl-2-bicyclo[2.2.1]heptyl), 5-(1,1-dimethyl-3-oxopentyloxycarbonyl-2-bicyclo[2.2.1]heptyl), 5-(tetrahydropyran-2-yloxycarbonyl-2-bicyclo[2.2.1]heptyl) and the like.

$R^2$ can be a linear, branched or cyclic fluoroalkyl or fluoro substituted alicyclic group having 1 to 20 carbon atoms. The term "fluoroalkyl" refers to an alkyl group wherein at least one hydrogen atom has been replaced with a fluorine atom and include but are not limited to, trifluoromethyl, difluoromethyl, 2,2,2-trifluoroethyl, pentafluoroethyl, 3,3,3-trifluoropropyl, 1,1,1,3,3,3-hexafluoroisopropyl, 3,3,3,4,4,4-hexafluorobutyl, 3,3,3,4,4,4,5,5,5-nonafluoropentyl, 3,3,3,4,4,4,5,5,5,6,6,6-dodecafluorohexyl, 3,3,3,4,4,4,5,5,5,6,6,6,7,7,7-pentadedecafluoroheptyl, 3,3,3,4,4,4,5,5,5,6,6,6,7,7,7,8,8,8-octadecafluorooctyl, 1,2,2,3,3,4,4,5-octafluorocyclopentyl, 2-(octafluoro-1-trifluoromethylcyclopentyl) ethyl and the like.

$R^2$ can be a polar group, such as $(CH_2)_n$—$OR^8$ where n is an integer from about 2 to about 10 and $R^8$ can be H, an $R^3$ group or an α-alkoxy linear, branched or cyclic alkyl group. Illustrative examples of alkyl group include but are not limited to methyl, ethyl, propyl, isopropyl, n-butyl, sec-butyl, tert-butyl, cyclohexyl, cyclopentyl, cycloheptyl, octyl, cyclooctyl, cyclononyl, cyclodecyl, norbornyl, isobornyl, adamantyl, adamantylmethylene, tricyclo[5,2,1,0$^{2,6}$]decanemethylene,

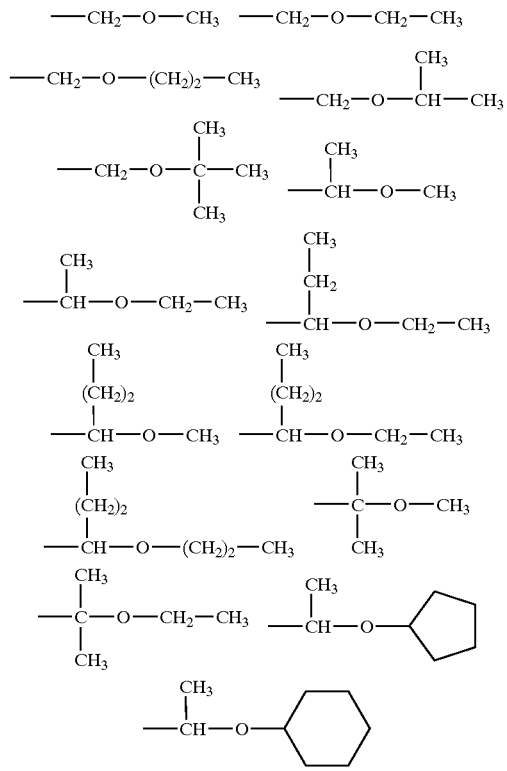

tetracyclo[4,4,0,1$^{25}$,1$^{7,10}$]dodecyl and the like. Examples of linear or branched α-alkoxy alkyl groups in $R^8$ include but are not limited to:

Illustrative examples of the cyclic α-alkoxy alkyl group include but are not limited to tetrahydrofuran-2-yl, 2-methyltetrahydrofuran-2-yl, tetrahydropyran-2-yl, 2-methyltetrahydropyran-2-yl and the like.

Examples of $(CH_2)_n$—$OR^8$ include, but are limited to, ethyl-1-oxomethyl, ethyl-1-oxoethyl, ethyl-1-oxopropyl, ethyl-1-oxoisopropyl, ethyl-1-oxo-n-butyl, ethyl-1-oxo-sec-butyl, ethyl-1-oxo-tert-butyl, ethyl-1-oxo-cyclohexyl, ethyl-1-oxo-cyclopentyl, ethyl-1-oxocycloheptyl, ethyl-1-oxooctyl, ethyl-1-oxocyclooctyl, ethyl-1-oxocyclononyl, ethyl-1-oxocyclodecyl, ethyl-1-oxonorbornyl, ethyl-1-oxoisobornyl, ethyl-1-oxoadamantyl, ethyl-1-oxoadamantylmethylene, ethyl-1-oxotricyclo[5,2,1$^{'2,6}$]decanemethylene, ethyl-1-oxotetracyclo[4,4,0,1$^{2,5}$,1$^{7,10}$]dodecyl, propyl-1-oxomethyl, propyl-1-oxoethyl, butyl-1-oxomethyl, penyl-1-oxomethyl, hexyl-1-oxomethyl, heptyl-1-oxomethyl, octyl-1-oxomethyl, nonanyl-1-oxomethyl, decyl-1-oxomethyl, ethyl-1-oxo-α-methoxymethyl, ethyl-1-oxo-α-methoxyethyl and the like.

$R^2$ can be a polar group such as $(CH_2)_n$—$(C=O)$—$OR^9$, where n has the same meaning as defined above and $R^9$ can be H, an $R^3$ group or an acid sensitive protecting group. Suitable examples of acid labile protecting groups in $R^9$ include but are not limited to tert-butyl group, 1,1-dimethylpropyl group, 1-methyl-1-ethylpropyl group, 1,1-diethylpropyl group, 1,1-dimethylbutyl group, 1-methyl-1-ethylbutyl group, 1,1-diethyl butyl group, 1,1-dimethylpentyl group, 1-methyl-1-ethylpentyl group, 1,1-diethylpentyl group, 1,1-dimethylhexyl group, 1-methyl-1-ethylhexyl group, 1,1-diethylhexyl group and the like, 1-methyl-1-cyclopentyl, 1-ethyl-1-cyclopentyl, 1-propyl-1-cyclopentyl, 1-butyl-1-cyclopentyl, 1-methyl-1-cyclohexyl, 1-ethyl-1-cyclohexyl, 1-propyl-1-cyclohexyl, 1-butyl-1- cyclohexyl, 2-methyl-2-adamantyl, 2-ethyl-2-adamantyl, 2-propyl-2-adamantyl, 2-butyl-2-adamanteyl, and 2-isopropyl-2-adamantyl and 1,1-dimethyl-3-oxobutyl, 1-ethyl-1-methyl-3-oxobutyl, 1-methyl-1-cyclohexyl-3-oxobutyl, 1,1-dimethyl-3-oxopentyl, tetrahydropyran-2-yl and the like. The examples of $(CH_2)_n$—(C=O)—$OR^9$ group include but are not limited to tert-butyloxycarbonylethyl, tert-butyloxycarbonylpropyl, tert-butyloxycarbonylbutyl, tert-butyloxycarbonylpentyl, tert-butyloxycarbonylhexyl, tert-butyloxycarbonylheptyl, tert-butyloxycarbonyloctyl, butyloxycarbonyloctyl, 1,1-dimethylpropyloxycarbonylethyl, 1-methyl-1-ethylpropyloxycarbonylethyl, 1,1-diethylpropyloxycarbonylethyl, 1,1-dimethylbutyloxycarbonylethyl, 1-methyl-1-ethylbutyloxycarbonylethyl, 1,1-diethyl butyloxycarbonylethyl, 1,1-dimethylpentyloxycarbonylethyl, 1-methyl-1-ethylpentyloxycarbonylethyl, 1,1-diethylpentyloxycarbonylethyl, 1,1-dimethylhexyloxycarbonylethyl, 1-methyl-1-ethylhexyloxycarbonylethyl, 1,1-diethylhexyloxycarbonylethyl and the like, 1-methyl-1-cyclohexyloxycarbonylethyl, 1-ethyl-1-cyclohexyloxycarbonylethyl, 1-propyl-1-cyclohexyloxycarbonylethyl, 1-butyl-1-cyclohexyloxycarbonylethyl, 2-methyl-2-adamantyloxycarbonylethyl, 2-ethyl-2-adamantyloxycarbonylethyl, 2-propyl-2-adamantyloxycarbonylethyl, 2-butyl-2-adamanteyloxycarbonylethyl, and 2-isopropyl-2-adamantyloxycarbonylethyl and 1,1-dimethyl-3-oxobutyl, 1-ethyl-1-methyl-3-oxobutyl, 1-methyl-1-cyclohexyl-3-oxobutyloxycarbonylethyl, 1,1-dimethyl-3-oxopentyloxycarbonylethyl, tetrahydropyran-2-yloxycarbonylethyl and the like.

$R^2$ can be a polar group, such as $(CH_2)_n$—$C(CF_3)R^{10}$—$OR^{11}$, where n has the same meaning as defined above and $R^{10}$ can be H or fluoromethyl, difluoromethyl or trifluoromethyl and $R^{11}$ can be H or an $R^3$ group. The examples of $(CH_2)_n$—$C(CF_3)R^{10}$—$OR^{11}$ group include, but are not limited, to (1,1,1-trifluoro-2-fluormethyl)butyloxy, (1,1,1-trifluoro-2-fluormethyl)butyloxymethyl, (1,1,1-trifluoro-2-fluormethyl)butyloxyethyl, (1,1,1-trifluoro-2-fluormethyl)butyloxypropyl, (1,1,1-trifluoro-2-fluormethyl)butyloxybutyl, (1,1,1-trifluoro-2-fluormethyl)pentyloxymethyl, (1,1,1-trifluoro-2-fluormethyl)hexyloxymethyl, (1,1,1-trifluoro-2-fluormethyl)heptaloxymethyl, (1,1,1-trifluoro-2-difluormethyl)octaloxymethyl, (1,1,1-trifluoro-2-difluormethyl)butyloxymethyl, (1,1,1-trifluoro-2-difluormethyl)pentaloxymethyl, (1,1,1-trifluoro-2-difluormethyl)hexaloxymethyl, (1,1,1-trifluoro-2-difluormethyl)heptaloxy, (1,1,1-trifluoro-2-trifluormethyl)butyloxymethyl, (1,1,1-trifluoro-2-trifluormethyl)pentaloxymethyl, (1,1,1-trifluoro-2-trifluormethyl)hexaloxymethyl, (1,1,1-trifluoro-2-trifluormethyl)heptaloxymethyl and the like.

$R^2$ can be a polar group, such as $(CH_2)_n$—O—(C=O)$R^3$, where n and $R^3$ have the same meaning as defined above. The examples of $(CH_2)_n$—O—(C=O)$R^3$ group include but are not limited to acetyloxyethyl, acetyloxypropyl, acetyloxybutyl, acetyloxypentyl, acetyloxyhexyl, acetyloxyheptyl, acetyloxyoctyl, ethylcarbonyloxyethyl, ethylcarbonyloxypropyl, ethylcarbonyloxybutyl, propylcarbonyloxyethyl and the like.

Suitable examples of monomers generating Structure (IA) include but are not limited to 3-(3,5,7,9,11,13,15-heptaethylpentacyclo[9.5.1.$1^{3,9}$,$1^{5,15}$.$1^{7,13}$]octa-siloxan-1-yl)propyl acrylate, 3-(3,5,7,9,11,13,15-heptaethylpentacyclo[9.5.13,9.$1^{5,15}$.$1^{7,13}$]octa-siloxan-1-yl) propyl methacrylate, 3-(3,5,7,9,11,13,15-heptamethylpentacyclo[9.5.1.$1^{39}$.$1^{5,}$$_{15}$.$1^{7,13}$]octa-siloxan-1-yl)propyl methacrylate, 3-(3,5,7,9,11,13,15-heptapropylpentacyclo[9.5.1.$1^{3,9}$.$1^{5,15}$.$1^{7,13}$]octa-siloxan-1-yl)propyl methacrylate, 3-(3,5,7,9,11,13,15-heptaisobutylpentacyclo[9.5.1.$1^{3,9}$.$_1$$^{5,15}$.$1^{7,13}$]octa-siloxan-1-yl)propyl methacrylate, 3-(3,5,7,9,11,13,15-hepta-tert-butylpentacyclo[9.5.$1^{3,9}$.$1^{5,15}$.$1^{7,13}$]octa-siloxan-1-yl)propyl methacrylate, 3-(3,5,7,9,11,13,15-heptacyclopentylpentacyclo[9.5.1$^{3,9}$.$1^{5,15}$.$1^{7,13}$]octa-siloxan-1-yl)propyl methacrylate, 3-(3,5,7,9,11,13,15-heptacyclohexylpentacyclo[9.5.1.$1^{3,9}$.$1^{5,15}$.$1^{7,13}$]octa-siloxan-1-yl) propyl methacrylate, 3-(3,5,7,9,11,13,15-heptaethylpentacyclo [9.5.1.$1^{3,9}$.$1^{5,15}$.$1^{7,13}$]octa-siloxan-1-yl) butyl methacrylate, 3-(3,5,7,9,11,13,15-heptaethylpentacyclo[9.5.1.$1^{3,9}$$_,$$_1$$5,5,_1$$^7,$$_{13}$]octa-siloxan-1-yl)pentyl methacrylate, 3-(3,5,7,9,11,13,15-heptaethylpentacyclo[9.5.1.$1^{3,9}$.$1^{5,15}$.$1^{7,13}$]octa-siloxan-1-yl)hexyl methacrylate, 3-(3,5,7,9,11,13,15-heptakis(3,3,3,4,4,4,5,5,5,6,6,6,7,7,7,8,8,8-octadecafluorooctyl)pentacyclo [9.5.1.$1^{3,9}$$1^{5,17}$$1^{7,13}$]octa-siloxan-1-yl)propyl methacrylate, 3-(3,5,7,9,11,13,15-heptakis{5-bicyclo[2.2.1]heptyl-2-(1,1,1-trifluoro-2-trifluoromethyl)propyl-2-oxomethyl)}pentacyclo[9.5.1.$1^{3,9}$.$1^{5,15}$.$1^{7,13}$]octa-siloxan-1-yl)propyl methacrylate, 3-(3,5,7,9,11,13,15-heptakis(tert-butyl)pentacyclo[9.5.1.$1^{3,9}$.$1^{5,15}$.$1^{7,13}$]octa-siloxan-1-yl) propyl methacrylate and the like.

Suitable examples of monomers generating Structure (IB) include but are not limited to 3-(13-hydroxy-1,3,5,9,11,13,15-heptamethyl-7-methyltetracyclo[9.5.1.$1^{3,9}$.$1^{5,15}$]octa-siloxan-7-yl)propyl acrylate, 3-(13-hydroxy-1,3,5,9,11,13,15-heptaethyl-7-methyltetracyclo[9.5.1.$1^{3,9}$.$1^{5,15}$]octa-siloxan-7-yl)propyl methacrylate, 3-(13-hydroxy-1,3,5,9,11,13,15-heptamethyl-7-methyltetracyclo[9.5.1.$1^{3,9}$.$1^{5,15}$]octa-siloxan-7-yl)butyl acrylate, 3-(13-hydroxy-1,3,5,9,11,13,15-heptamethyl-7-ethyltetracyclo[9.5.1.$1^{3,9}$.$1^{5,15}$]octa-siloxan-7-yl)propyl acrylate, 3-(13-trimethylsiloxy-1,3,5,9,11,13,15-heptamethyl-7-methyltetracyclo[9.5.1.$1^{3,9}$.$1^{5,15}$]octa-siloxan-7-yl)propyl acrylate, 3-(13-triethylsiloxy-1,3,5,9,11,13,15-heptamethyl-7-methyltetracyclo[9.5.1.$1^{3,9}$.$1^{5,15}$]octa-siloxan-7-yl)propyl acrylate, 3-(13-trimethylsiloxy-1,3,5,9,11,13,15-heptamethyl-7-methyltetracyclo[9.5.1.$1^{3,9}$.$1^{5,15}$] octa-siloxan-7-yl)propyl methacrylate, 3-(13-trimethylsiloxy-1,3,5,9,11,13,15-heptaethyl-7-methyltetracyclo[9.5.1.$1^{3,9}$.$1^{5,15}$]octa-siloxan-7-yl)propyl methacrylate, 3-(13-trimethylsiloxy-1,3,5,9,11,13,15-heptacyclopentyl-7-methyltetracyclo[9.5.1.$1^{3,9}$.$1^{5,15}$]octa-siloxan-7-yl)propyl methacrylate, 3-(13-trimethylsiloxy-1,3,5,9,11,13,15-heptaisobutyl-7-methyltetracyclo[9.5.1.13,9.15.1 $^5$]octa-siloxan-7-yl)propyl methacrylate, 3-(13-trimethylsiloxy-1,3,5,9,11,13,15-heptacycloheptyl-7-methyltetracyclo[9.5.1.$1^{3,9}$.$1^{5,15}$]octa-siloxan-7-yl)propyl methacrylate, 3-(13-tert-butyldimethylsiloxy-1,3,5,9,11,13,15-heptacycloheptyl-7-methyltetracyclo[9.5.1.$1^{3,9}$.$1^{15,5}$] octa-siloxan-7-yl)propyl methacrylate, 3-(13-dimethyl-1,1,1-trifluoropropylsiloxy-1,3,5,9,11,13,15-heptacycloheptyl-7-methyltetracyclo[9.5.1.$1^{3,9}$.$1^{5,15}$]octa-siloxan-7-yl)propyl methacrylate, 3-(13-dimethyl-3,3,3,4,4,4,5,5,5,6,6,6,7,7,7,8,8,8-octadecafluorooctylsiloxy-1,3,5,9,11,13,15-heptacycloheptyl-7-methyltetracyclo[9.5.1.$1^{3,9}$.$1^{5,15}$]octa-siloxan-7-yl)propyl methacrylate, and the like.

Suitable examples of monomers generating Structure (IC) include but are not limited to 3-[(7,14-dihydroxy-1,3,5,7,9,11,14-heptamethyltricyclo[7.3.3.$1^{5,11}$]heptasiloxan-3-yloxy)dimethylsilyl]propyl acrylate, 3-[(7,14-dihydroxy-1,3,5,7,9,11,14-heptamethyltricyclo[7.3.3.$1^{5,15}$]heptasiloxan-3-yloxy)dimethylsilyl]propyl methacrylate, 3-[(7,14-dihydroxy-1,3,5,7,9,11,14-heptaethyltricyclo[7.3.3.$1^{5,11}$] heptasiloxan-3-yloxy)dimethylsilyl]propyl methacrylate, 3-[(7,14-dihydroxy-1,3,5,7,9,11,14-heptaisobutyltricyclo [7.3.3.$1^{5,11}$]heptasiloxan-3-yloxy)dimethylsilyl]propyl methacrylate, 3-[(7,14-dihydroxy-1,3,5,7,9,11,14- heptacyclopentyltricyclo[7.3.3.1$^{5,11}$]heptasiloxan-3-yloxy) dimethylsilyl]propyl methacrylate, 3-[(7,14-dihydroxy-1,3, 5,7,9,11,14-heptacyclohexyltricyclo[7.3.3.1$^{5,11}$] heptasiloxan-3-yloxy)dimethylsilyl]propyl methacrylate, 3-[(7,14-dihydroxy-1,3,5,7,9,11,14-heptamethyltricyclo [7.3.3.1$^{5,11}$]heptasiloxan-3-yloxy)dimethylsilyl]butyl acrylate, 3-[(7,14-di(trimethylsiloxy)-1,3,5,7,9,11,14-heptamethyltricyclo[7.3.3.1$^{5,11}$]heptasiloxan-3-yloxy) dimethylsilyl]propyl acrylate and the like.

The novel copolymer in addition to at least one repeating unit of Structure I further comprises at least one second repeating unit represented by Structure (III):

Structure (III)

wherein $R^1$ has the same meaning as defined above and $R^{12}$ is an acid labile group. Any suitable acid labile group may be employed. Examples of acid labile protecting groups include, but are not limited to, tert-butyl group, 1,1-dimethylpropyl group, 1-methyl-1-ethylpropyl group, 1,1-diethylpropyl group, 1,1-dimethylbutyl group, 1-methyl-1-ethylbutyl group, 1,1-diethyl butyl group, 1,1-dimethylpentyl group, 1-methyl-1-ethylpentyl group, 1,1-diethylpentyl group, 1,1-dimethylhexyl group, 1-methyl-1-ethylhexyl group, 1,1-diethylhexyl group and the like, 1-methyl-1-cyclopentyl, 1-ethyl-1-cyclopentyl, 1-propyl-1-cyclopentyl, 1-butyl-1-cyclopentyl, 1-methyl-1-cyclohexyl, 1-ethyl-1-cyclohexyl, 1-propyl-1-cyclohexyl, 1-butyl-1-cyclohexyl, 2-methyl-2-adamantyl, 2-ethyl-2-adamantyl, 2-propyl-2-adamantyl, 2-butyl-2-adamantyl, and 2-isopropyl-2-adamantyl and 1,1-dimethyl-3-oxobutyl, 1-ethyl-1-methyl-3-oxobutyl, 1-methyl-1-cyclohexyl-3-oxobutyl, 1,1-dimethyl-3-oxopentyl, tetrahydropyran-2-yl and the like.

The examples of monomers generating Structure (III) include but are not limited to 1,1-dimethylpropylacrylate, 1,1-dimethylpropylmethacrylate, 1-methyl-1-ethylpropylacrylate, 1-methyl-1-ethylpropylmethacrylate, 1,1-diethylpropylacrylate, 1,1-diethylpropylmethacrylate, 1,1-dimethylbutylacrylate, 1,1-dimethylbutylmethacrylate, 1-methyl-1-ethylbutylacrylate, 1-methyl-1-ethylbutylmethacrylate, 1,1-diethyl butylacrylate, 1,1-diethyl butylmethacrylate, 1,1-dimethylpentylacrylate, 1,1-dimethylpentylmethacrylate, 1-methyl-1-ethylpentylacrylate, 1,1-diethylpentylacrylate, 1,1-dimethylhexylacrylate, 1-methyl-1-ethylhexylacrylate, 1,1-diethylhexylacrylate and the like, 1-methyl-1-cyclopentylacrylate, 1-ethyl-1-cyclopentylacrylate, 1-propyl-1-cyclopentylacrylate, 1-butyl-1-cyclopentyl-acrylate, 1-methyl-1-cyclopentylmethacrylate, 1-ethyl-1-cyclopentylmethacrylate, 1-propyl-1-cyclopentylmethacrylate, 1-butyl-1-cyclopentylmethacrylate, 1-methyl-1-cyclohexylacrylate, 1-methyl-1-cyclohexylmethacrylate 1-ethyl-1-cyclohexylacrylate, 1-propyl-1-cyclohexylacrylate, 1-butyl-1-cyclohexylacrylate, 2-methyl-2-adamantylacrylate, 2-methyl-2-adamantylmethacrylate, 2-ethyl-2-adamantylacrylate, 2-ethyl-2-adamantylmethacrylate 2-propyl-2-adamantylacrylate, 2-butyl-2-adamantylacrylate, 2-isopropyl-2-adamantylacrylate, 2-isopropyl-2-adamantylmethacrylate and 1,1-dimethyl-3-oxobutylacrylate, 1-methyl-1-ethyl-3-oxobutylacrylate, 1-methyl-1-cyclohexyl-3-oxobutylacrylate, 1,1-dimethyl-3-oxopentylacrylate, tetrahydropyran-2-yl acrylate, tetrahydropyran-2-yl methacrylate and the like.

The concentration of repeating units in the polymer having Structure (I) may range from about 1% to about 50 molar %. A preferred concentration of repeating units in the polymer having Structure (I) is from about 5% to about 25 molar %. A more preferred concentration of repeating units in the polymer having Structure (I) is from about 5 to about 20 molar %. A most preferred concentration of repeating units in the polymer having Structure (I) is from about 5% to about 15 molar %.

The concentration of repeating units in the polymer having Structure (III) may range from about 15% to about 65 molar %. A preferred concentration of repeating units in the polymer having Structure (III) is from about 20% to about 50 molar %. A more preferred concentration of repeating units in the polymer having Structure (III) is from about 20 to about 45 molar %. A most preferred concentration of repeating units in the polymer having Structure (III) is from about 20% to about 40 molar %.

Copolymers comprising repeating units of Structures (I) and (III) may contain additional repeating units generated from copolymerization with other ethylenically unsaturated, polymerizable monomer types. Examples of additional monomer types include, but are not limited to, acrylates, methacrylates, anhydrides having a ethylenically unsaturated group, hydroxystyrenes, styrene substituted with an hexafluoroisopropyl group, vinyl ethers, ethylenically unsaturated, polymerizable silicon compounds and vinyl esters. Preferred co-monomers include those monomers generating Structure (IV) or Structure (VI) after polymerization. Other preferred comonomers are ethylenically unsaturated, polymerizable silicon compounds.

A preferred copolymer comprises repeating units of Structure (I), Structure (III), and Structure (IV),

Structure (IV)

wherein $R^1$ has the same meaning as defined above and $R^{13}$ is selected from the following structures (Va–Vg).

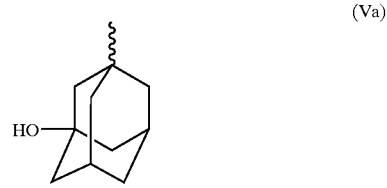

(Va)

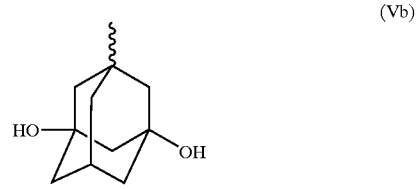

(Vb)

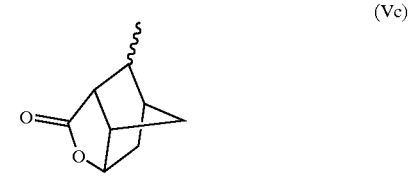

(Vc)

(Vd)

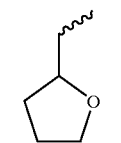

(Ve)

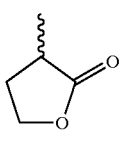

(Vf)

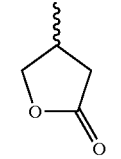

(Vg)

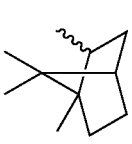

The concentration of repeating units in the polymer having Structure (IV) may range from about 15% to about 75 molar %. A preferred concentration of repeating units in the polymer having Structure (IV) is from about 20% to about 50 molar %. A more preferred concentration of repeating units in the polymer having Structure (IV) is from about 25 to about 50 molar %. A most preferred concentration of repeating units in the polymer having Structure (IV) is from about 30% to about 50 molar %. The content of first and second repeating units of Structure (I) and (III) are as defined above.

In another embodiment, the novel copolymer comprises repeating units of Structures (I), (III), (IV), and an unprotected alkali solubilizing moiety. Examples of unprotected alkali solubility moieties are phenolic groups, carboxylic acids, and fluorinated alcohols. Examples of monomers generating alkali solubilizing moieties after polymerization include hydroxystyrene (and its precursors), acrylic acid, methacrylic acid, and 4-[2-(1,1,1,3,3,3-hexafluoro-2-hydroxy)-propyl]styrene.

The concentration of repeating units in the polymer having the alkali solubilizing moiety may range from about 1% to about 20 molar %. A preferred concentration of repeating units in the polymer having the alkali solubilizing moiety is from about 3% to about 15 molar %. A more preferred concentration of repeating units in the polymer having the alkali solubilizing moiety is from about 5 to about 15 molar %. The content of first and second repeating units of Structure (I) and (III) and the repeating unit of Structure (IV) are as defined above.

A preferred copolymer comprises repeating units of Structure (1), Structure Ill, and Structure (Vl), Structure (VI)

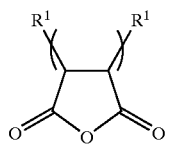

wherein $R^1$ has the same meaning as defined above. Examples of suitable monomers generating Structure (VI) include maleic anhydride, citraconic anhydride and 2,3-dimethylmaleic anhydride.

The concentration of repeating units in the polymer having Structure (VI) may range from more than 1% to about 50 molar %. A preferred concentration of repeating units in the polymer having Structure (VI) is from more than 1% to about 40 molar %. A more preferred concentration of repeating units in the polymer having Structure (VI) is from about 10% to about 40 molar %. A most preferred concentration of repeating units in the polymer having Structure (VI) is from about 20% to about 40 molar %. The content of first and second repeating units of Structures (I) and (III) are as defined above.

A preferred copolymer comprises repeating units of Structure (I), Structure (III), and repeating units derived from ethylenically unsaturated, polymerizable silicon compounds different from Structures (IA), (IB), and (IC). Any suitable silicon containing monomer may be employed as long as it has a polymerizable double bond. Examples of such silicon containing monomers include, but are not limited to, allyltrialkylsilanes, vinyltrialkylsilanes, trialkylsilyl methacrylates or acrylates, (trialkylsiloxy)alkyl methacrylates or acrylates and cyclic silyl methacrylates or acrylates. Preferred examples of silicon containing monomers include allytrimethylsilane, vinyltrimethylsilane, methacryloxy methyltrimethylsilane, and methacryloxy propyltris (trimethylsiloxy)silane.

The concentration of repeating units in the polymer derived from ethylenically unsaturated, polymerizable silicon compounds different from Structures (IA), (IB), and (IC) may range from about 15% to about 65 molar %. A preferred concentration of repeating units in the polymer derived from ethylenically unsaturated, polymerizable silicon compounds different from Structures (IA), (IB), and (IC) is from about 20% to about 50 molar %. A more preferred concentration of repeating units in the polymer derived from ethylenically unsaturated, polymerizable silicon compounds different from Structures (IA), (IB), and (IC) is from about 25 to about 50 molar %. A most preferred concentration of repeating units in the polymer derived from ethylenically unsaturated, polymerizable silicon compounds different from Structures (IA), (IB), and (IC) is from about 30% to about 50 molar %. The content of first and second repeating units of Structures (I) and (III) are as defined above.

Another preferred copolymer comprises repeating units of Structure (I), Structure (III), Structure (VI), and repeating units derived from ethylenically unsaturated, polymerizable silicon compounds different from Structures (IA), (IB), and (IC). The content of first and second repeating units of Structures (I) and (III) and repeating units having Structure (VI) are as defined above. The concentration of repeating units in the polymer derived from ethylenically unsaturated, polymerizable silicon compounds different from Structures (IA), (IB), and (IC) may range from about 10% to about 50 molar %. A preferred concentration of repeating units in the polymer derived from ethylenically unsaturated, polymerizable silicon compounds different from Structures (IA), (IB), and (IC) is from about 15% to about 45 molar %. A more preferred concentration of repeating units in the polymer derived from ethylenically unsaturated, polymerizable silicon compounds different from Structures (IA), (IB), and (IC) is from about 15 to about 40 molar %. A most preferred concentration of repeating units in the polymer derived from ethylenically unsaturated, polymerizable silicon compounds different from Structures (IA), (IB), and (IC) is from about 20% to about 35 molar %.

The level of silicon in copolymers of this invention will generally be at a level of from about 4 to about 15% by weight, preferably from about 8 to about 14% by weight which is sufficient to allow adequate pattern transfer into the undercoat of a bilayer system. The molar % of the monomers required to obtain this level will vary depending on the silicon content of the individual monomer.

Monomers generating Structures (IA), (IB), and (IC) may be purchased commercially or synthesized by condensation of $RSiCl_3$ or $RSi(OCH_3)_3$ and as necessary, corner capped with an appropriate trichlorosilane coupling agent under basic conditions. (see Feher, F. J., Budzichowski, T. A., Blanski, R. L., Weller, K. J., Ziller, J. W. Organometallics 1991,10,2526–2528 and Lichtenhan, J. D., Otonari, Y. A., Carr, M. J. Macromolecules, 1995, 28, 8435–8437. See also Lichtenhan,J. D. in Silsesquioxane-Based Polymers, Salmone, J. C., Ed.; Polymeric Materials Encyclopedia, CRC Press, (1996) Vol 107768–7778; "Nanostructured Chemicals: A New Era in Chemical Technology," J. D. Lichtenhan, J. J. Schwab, W. A. Reinerth Chemical Innovation January (2001) pp 3–5; and J. D. Lichtenhan, "Polyhedral Oligomeric Silsesquioxanes: BuildingBlocks for Silsesquioxane-Based Polymers and Hybrid Materials", 1995, Comments Inorg. Chem. 17, 115–130.

The novel copolymers of this invention can be prepared from the corresponding monomers by any suitable conventional polymerization process which reacts an ethylenically unsaturated group. Such processes include, but are not limited to, free radical or controlled radical polymerizations. Such processes typically are run in a solvent or solvent mixture using a catalyst or initiator. Initiators should be chosen based on the temperature to be employed in the polymerization, which in turn may be set by the boiling point of the solvent. The temperature employed may depend on the monomer stability, and the catalytic ability of the catalyst at the operating temperature or by the decomposition half-life of the initiator.

Suitable initiation concentrations are between about 0.001 to about 10.0% moles of initiator to total moles of monomer. The preferred range of initiator concentration is between about 0.01 to about 8.0% moles of initiator to total moles of monomer. The most preferred range of initiator concentration is between about 0.1 to about 6.0% moles of initiator to total moles of monomer.

Examples of suitable free radical initiators include, but are not limited to, benzoyl peroxide, 2,2'-azobisisobutyronitrile, 2,2'-azobis(methylisobutyronitrile), dimethyl 2,2'-azobisisobutyrate and lauroyl peroxide. Optionally, a chain transfer agent (e.g. carbon tetrabromide or 1-dodecanethiol) may be included.

Suitable solvents for polymerization include, but are not limited to, dioxane, tetrahydrofuran, 2-methyltetrahydrofuran, acetonitrile, toluene, ethylacetate, propylene glycol monomethyl ether acetate, tetrahydropyran, methyl ethyl ketone, methyl isobutyl ketone, and diglyme or any combination thereof. Polymers may be isolated by precipitation of the polymerization solution into an appropriate amount of solvent in which the polymer is insoluble. The precipitated polymer may be isolated by filtration and dried using conventional techniques known by someone skilled in the art.

The copolymer of the present invention has a weight average molecular weight (Mw) in terms of polystyrene of from about 5000 to about 45,000. The copolymer of the present invention has a weight average molecular weight (Mw) in terms of polystyrene of preferably from 7,000 to about 30,000 and more preferably from about 10,000 to about 20,000. If the weight average molecular weight (Mw) in terms of polystyrene exceeds 30,000; the resulting photoresist composition may have low definition.

The value of Mw can be determined by such standard methods as gel permeation chromatography as described, for example, in Jan Rabek, Experimental Methods in Polymer Chemistry, John Wiley & Sons, New York, 1983.

Photosensitive compositions can be formulated using the polymers of the present invention. The photosensitive compositions will comprise the polymers of this invention and a photoacid generator. The polymers of this invention may be blended with another photoresist polymer, which may contain silicon. Generally, any photoresist polymer with alkali solubilizing groups protected by acid sensitive groups may be blended in these photosensitive compositions. Suitable photoresist polymers for blending and containing silicon but not of this invention include acrylic polymers such as those described in U.S. Pat. No. 6,146,793 and U.S. Pat. No. 6,165,682 herein incorporated by reference. Suitable non-silicon containing photoresist polymers for blending include acrylic polymers such as described in U.S. Pat. No. 4,491,628, U.S. Pat. No. 6,284,430, and U.S. Pat. No. 6,042,997 herein incorporated by reference.

Any suitable photoacid generator compound may be used in the photoresist composition. Preferred photoacid generators are those generating sulfonic acids. Suitable classes of photoacid generators generating sulfonic acids include but are not limited to sulfonium or iodonium salts, oximidosulfonates, bissulfonyldiazomethanes, and nitrobenzylsulfonate esters. Suitable photoacid generator compounds are disclosed, for example, in U.S. Pat. No. 5,558,978 and U.S. Pat. No. 5,468,589, which are incorporated herein by reference.

Still other suitable examples of photoacid generators are triphenylsulfonium bromide, triphenylsulfonium chloride, triphenylsulfonium iodide, triphenylsulfonium hexafluorophosphate, triphenylsulfonium hexafluoroarsenate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiopheniumn chloride and 4-hydroxy-2-methylphenylhexahydrothiopyrylium chloride.

Additional examples of suitable photoacid generators for use in this invention include triphenylsulfonium perfluorooctanesulfonate, triphenylsulfonium perfluorobutanesulfonate, methylphenyldiphenylsulfonium perfluorooctanesulfonate, methylphenyldiphenysulfonium perfluorooctanesulfonate, 4-n-butoxyphenyldiphenylsulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium 2,4,6-triisopropylbenzenesulfonate, phenylthiophenyldiphenylsulfonium 4-dodecylbenzensulfonic acid, tris(-t-butylphenyl) sulfonium perfluorooctanesulfonate, tris(-t-butylphenyl) sulfonium perfluorobutanesulfonate, tris(-t-butylphenyl) sulfonium 2,4,6-triisopropylbenzenesulfonate, tris(-t-butylphenyl)sulfonium benzenesulfonate, and phenylthiophenyldiphenylsulfonium perfluorooctanesulfonate.

Examples of suitable iodonium salts for use in this invention include but are not limited to diphenyl iodonium perfluorobutanesulfonate, bis-(t-butylphenyl)iodonium perfluorobutanesulfonate, bis-(t-butylphenyl)iodonium perfluorooctanesulfonate, diphenyl iodonium perfluorooctanesulfonate, bis-(t-butylphenyl)iodonium benzenesulfonate, bis-(t-butylphenyl)iodonium 2,4,6-triisopropylbenzenesulfonate, and diphenyliodonium 4-methoxybenzensulfonate.

Further examples of suitable photoacid generators for use in this invention are bis(p-toluenesulfonyl)diazomethane, methylsulfonyl p-toluenesulfonyidiazomethane, 1-cyclohexylsulfonyl-1-(1,1-dimethylethylsulfonyl)diazometane, bis(1,1-dimethylethylsulfonyl)diazomethane, bis(1-methylethylsulfonyl)diazomethane, bis(cyclohexylsulfonyl)

diazomethane, 1-p-toluenesulfonyl-1-cyclohexylcarbonyldiazomethane, 2-methyl-2-(p-toluenesulfonyl) propiophenone, 2-methanesulfonyl-2-methyl-(4-methylthiopropiophenone, 2,4-methyl-2-(p-toluenesulfonyl)pent-3-one, 1-d iazo-1-methylsulfonyl4-phenyl-2-butanone, 2-(cyclohexylcarbonyl-2-(p-toluenesulfonyl)propane, 1-cyclohexylsulfonyl-1 cyclohexylcarbonyldiazomethane, 1-diazo-1-cyclohexylsulfonyl-3,3-dimethyl-2-butanone, 1-diazo-1-(1, 1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, 2,4-dinitrobenzyl p-trifluoromethylbenzenesulfonate.

The photoacid generator compound is typically employed in the amounts of about 0.1 to 20% by weight of polymer solids and more preferably about 1% to 10% by weight of polymer solids. Preferred photoacid generators are sulfonium salts. The photoacid generator may be used alone or in combination with one or more photoacid generators. The percentage of each photoacid generator in photoacid generator mixtures is between about 10% to about 90% of the total photoacid generator mixture. Preferred photoacid generator mixtures contain about 2 or 3 photoacid generators. Such mixtures may be of the same class or different classes. Examples of preferred mixtures include sulfonium salts with bissulfonyldiazomethane compounds, sulfonium salts and imidosulfonates, and two sulfonium salts.

The choice of solvent for the photoresist composition and the concentration thereof depends principally on the type of functionalities incorporated in the acid labile polymer, the photoacid generator, and the coating method. The solvent should be inert, should dissolve all the components in the photoresist, should not undergo any chemical reaction with the components and should be re-removable on drying after coating. Suitable solvents for the photoresist composition may include ketones, ethers and esters, such as methyl ethyl ketone, methyl isobutyl ketone, 2-heptanone, cyclopentanone, cyclohexanone, 2-methoxy-1-propylene acetate, 2-methoxyethanol, 2-ethoxyothanol, 2-ethoxyethyl acetate, 1-methoxy-2-propyl acetate, 1,2-dimethoxy ethane ethyl acetate, cellosolve acetate, propylene glycol monoethyl ether acetate, methyl lactate, ethyl lactate, methylpyruvate, ethyl pyruvate, methyl 3-methoxypropionate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like.

In an additional embodiment, base additives may be added to the photoresist composition. One purpose of the base additive is to scavenge protons present in the photoresist prior to being irradiated by the actinic radiation. The base prevents attack and cleavage of the acid labile groups by the undesirable acids, thereby increasing the performance and stability of the resist. A second purpose is to have control diffusion of the photogenerated acid. The percentage of base in the composition should be significantly lower than the photoacid generator because it would not be desirable for the base to interfere with the cleavage of the acid labile groups after the photoresist composition is irradiated. The preferred range of the base compounds, when present, is about 3% to 50% by weight of the photoacid generator compound. Suitable examples of base additives are 2-methylimidazole, triisopropylamine, 4-dimethylaminopryidine, 4,4'-diaminodiphenyl ether, 2,4,5 triphenyl imidazole and 1,5-diazobicyclo[4.3.0]non-5-ene.

Dyes may be added to the photoresist to increase the absorption of the composition to the actinic radiation wavelength. The dye must not poison the composition and must be capable of withstanding the process conditions including any thermal treatments. Examples of suitable dyes are fluorenone derivatives, anthracene derivatives or pyrene derivatives. Other specific dyes that are suitable for photoresist compositions are described in U.S. Pat. No. 5,593,812.

The photoresist composition may further comprise conventional additives such as adhesion promoters and surfactants. A person skilled in the art will be able to choose the appropriate desired additive and its concentration The photoresist composition is applied uniformly to a substrate by known coating methods. For example, the coatings may be applied by spin-coating, dipping, knife coating, lamination, brushing, spraying, and reverse-roll coating. The coating thickness range generally covers values of about 0.1 to more than 10 mm. After the coating operation, the solvent is generally removed by drying. The drying step is typically a heating step called soft bake where the resist and substrate are heated to a temperature of about 50° C. to 150° C. for about a few seconds to a few minutes; preferably for about 5 seconds to 30 minutes depending on the thickness, the heating element and end use of the resist.

The photoresist compositions are suitable for a number of different uses in the electronics industry. For example, it can be used as electroplating resist, plasma etch resist, solder resist, resist for the production of printing plates, resist for chemical milling or resist in the production of integrated circuits. The possible coatings and processing conditions of the coated substrates differ accordingly.

For the production of relief structures, the substrate, which may or may not be provided with an undercoat layer, is coated with the photoresist composition is exposed imagewise. The term 'imagewise' exposure includes both exposure through a photomask containing a predetermined pattern, exposure by means of a computer controlled laser beam which is moved over the surface of the coated substrate, exposure by means of computer-controlled electron beams, and exposure by means of X-rays or UV rays through a corresponding mask.

Radiation sources, which can be used, are all sources that emit radiation to which the photoacid generator is sensitive. Examples include high pressure mercury lamp, KrF excimer lasers, ArF excimer lasers, electron beams and x-rays sources.

The process described above for the production of relief structures preferably includes, as a further process measure, heating of the coating between exposure and treatment with the developer. With the aid of this heat treatment, known as "post-exposure bake", virtually complete reaction of the acid labile groups in the polymer resin with the acid generated by the exposure is achieved. The duration and temperature of this post-exposure bake can vary within broad limits and depend essentially on the functionalities of the polymer resin, the type of acid generator and on the concentration of these two components. The exposed resist is typically subjected to temperatures of about 50° C. to 150° C. for a few seconds to a few minutes. The preferred post exposure bake is from about 80° C. to 130° C. for about 5 seconds to 300 seconds.

After imagewise exposure and any heat treatment of the material, the exposed areas of the photoresist are removed by dissolution in a developer. The choice of the particular developer depends on the type of photoresist; in particular on the nature of the polymer resin or the photolysis products generated. The developer can include aqueous solutions of bases to which organic solvents or mixtures thereof may have been added. Particularly preferred developers are aqueous alkaline solutions. These include, for example, aqueous solutions of alkali metal silicates, phosphates, hydroxides and carbonates, but in particular of tetra alkylammonium hydroxides, and more preferably tetramethylammonium hydroxide (TMAH). If desired, relatively small amounts of wetting agents and/or organic solvents can also be added to these solutions.

After the development step, the substrate carrying the resist coating is generally subjected to at least one further treatment step, which changes substrate in areas not covered by the photoresist coating. Typically, this can be implantation of a dopant, deposition of another material on the substrate or an etching of the substrate. This is usually followed by the removal of the resist coating from the substrate using a suitable stripping method.

The resist of this invention may be coated over an undercoat to form a bilayer resist. Films of undercoats are typically spun cast from solvents suitable for photoresist applications and baked similar to photoresist. Film thickness of the undercoat will vary depending on the exact application but generally range from about 800 Angstroms to about 10,000 angstroms. Thickness of from about 1500 Angstroms to about 5000 Angstroms are preferred.

Suitable undercoats have several required characteristics. First, there should be no intermixing between the undercoat and resist. Generally this is achieved by casting a film of undercoat and crosslinking it to reduce casting solvent solubility. The crosslinking may be thermally or photochemically induced. Examples of this photochemical and thermal crosslinking may be found in U.S. Pat. No. 6,146,793, U.S. Pat. No. 6,054,248, U.S. Pat. No. 6,323,287, U.S. Pat. No. 6,165,682 and U.S. Pat. No. 6,610,808 incorporated by reference. Undercoats also generally are designed to have good substrate plasma etch resistance. Generally, the optical (n,k) parameters of a suitable undercoat are optimized for the exposure wavelength to minimize reflections.

Imaging the photosensitive composition of this invention on the overcoat is substantially the same as on a substrate. After images are formed in the radiation sensitive resist, the substrate will be placed in a plasma-etching environment comprising oxygen so that the undercoat will be removed in the area unprotected by the resist. The silicon in the silicon containing monomer unit forms silicon dioxide when exposed to an oxygen plasma and protects the resist from being etched so that relief structures can be formed in the undercoat layer.

After the oxygen plasma step, the substrate carrying the bilayer relief structure is generally subjected to at least on further treatment step, which changes the substrate in areas not covered by the bilayer coating. Typically this can be implantation of a dopant, deposition of another material on the substrate or an etching of the substrate. This is usually followed by the removal of the resist and its products and the undercoat.

To illustrate the present invention, the following examples are provided. It should be understood that the present invention is not limited to the examples described.

EXPERIMENTAL
General Synthetic Procedure for Polymerization in tetrahydrofuran (THF), 10 Gram Scale:

The mixture of monomers was dissolved in THF under $N_2$ in a round bottom flask equipped with a reflux condenser, a temperature probe and a gas inlet. The mixture was heated to 55° C. while stirring. The solution was degassed by bubbling $N_2$ into the solution through a syringe needle for 15 minutes. A solution of initiator in THF was added by syringe and the solution was heated to 65° C. for 24 hours under a $N_2$ atmosphere. The reaction mixture was then cooled to room temperature and added dropwise to pentanes or hexanes (500 ml). The solid polymer was isolated by filtration and washed with pentanes or hexanes (50 mL×2). After filtration, the solid was dried at 60° C. for 24 h under vacuum. Molecular weights and molecular weight distributions were measured using a Waters Corp. liquid chromatograph (refractive index detection, Millennium (GPC V software), equipped with the following Phenogel-10, 7.8× 250 mm columns: $10^{-4}$ Å. 500 Å & 50 Å (from Phenomena) and THF eluent. Thermal decomposition measurements (TGA) were performed using a Perkin-Elmer thermal gravimetric analyzer. The glass transition temperature (Tg) of the polymer was measured using a Perkin-Elmer Pyris 1 Differential Scanning Calorimeter at a heating rate of 20° C./minute. The structure and composition of polymer were analyzed with a $^1H$ NMR using a Bruker 400 MHz NMR-spectrometer. See Table 1 for analytical data of the polymer examples.

Polymer Example 1

The mixture of monomers [(1-methyl-1-tricyclo[3.3.1.13,7]dec-1-yl) ethyl methacrylate (X-AdMA) (2.55 g, 9.718 mmol), 2-methacryloxy-γ-butyrolactone (2.25 g, 14.41 mmol), (3,5-dihydroxytricyclo[3.3.1.13,7]dec-1-yl) methacrylate (DHMA) (1.72 g, 7.20 mmol) and 3-(3,5,7,9,11,13,15-heptaethylpentacyclo [$9.5.1.1^{3,9}.1^{5,15}.1^{7,13}$]octa-siloxan-1-yl) propyl methacrylate (methacrylEthyl-POSS) (3.49 g, 4.67 mmol)] and chain transfer agent 1-dodecanethiol (0.12 g, 0.592 mmol) were dissolved in THF (28.57 g, 35% solid) in a 100 mL three necked round bottom flask. The initiator dimethyl 2,2'-azobis(2-methylpropionate) (0.41 g, 1.78 mmol) dissolved in THF (2 g) was added to the mixture at 55° C. and was heated to 65° C. for 24 hours. The polymer was processed as described in the general procedure.

| Composition | % Si | MW | PDI | Tg (° C.) |
|---|---|---|---|---|
| 30/24/32/14 | 10.2 | 14,347 | 2.13 | 120 |

Polymer Example 2

The mixture of monomers [maleic anhydride (2.07 g, 21.1 mmol), allyltrimethylsilane (2.34 g, 20.47 mmol), X-AdMA (3.84 g, 14.63 mmol) and methacrylEthyl-POSS (1.75 g, 2.34 mmol] was dissolved in THF (18.5 g, 35% solid) in a 100 mL three necked round bottom flask. The initiator 2,2'azobis(2-methylbutyronitrile) (Vazo® 67) (0.04 g, 0.208 mmol) dissolved in THF (2 g) was added to the mixture at 55° C. and was heated to 65° C. for 24 hours. No chain transfer agent was used. The polymer was processed as described in the general procedure.

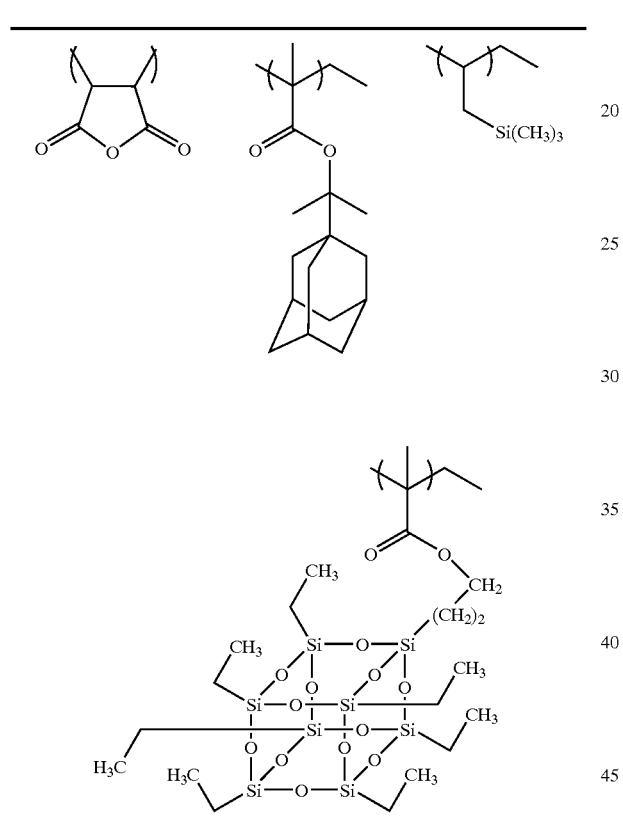

| Composition | % Si | MW | PDI | Tg (° C.) |
|---|---|---|---|---|
| 41/28/24/7 | 11.16 | 20.387 | 2.86 | >160 |

Polymer Examples 3

The mixture of monomers [maleic anhydride (1.81 g, 18.45 mmol), allyltrimethylsilane (2.11 g, 18.45 mmol, X-AdMA (4.41 g, 16.8 mmol) and methacrylEthyl-POSS (1.67 g, 2.34 mmol] was dissolved in THF (18.5 g, 35% solid) in a 100 mL three necked round bottom flask. The initiator Vazo® 67 (0.04 g, 0.208 mmol) dissolved in THF (2 g) was added to the mixture at 55° C. and was heated to 65° C. for 24 hours. No chain transfer agent was used. The polymer was processed as described in the general procedure.

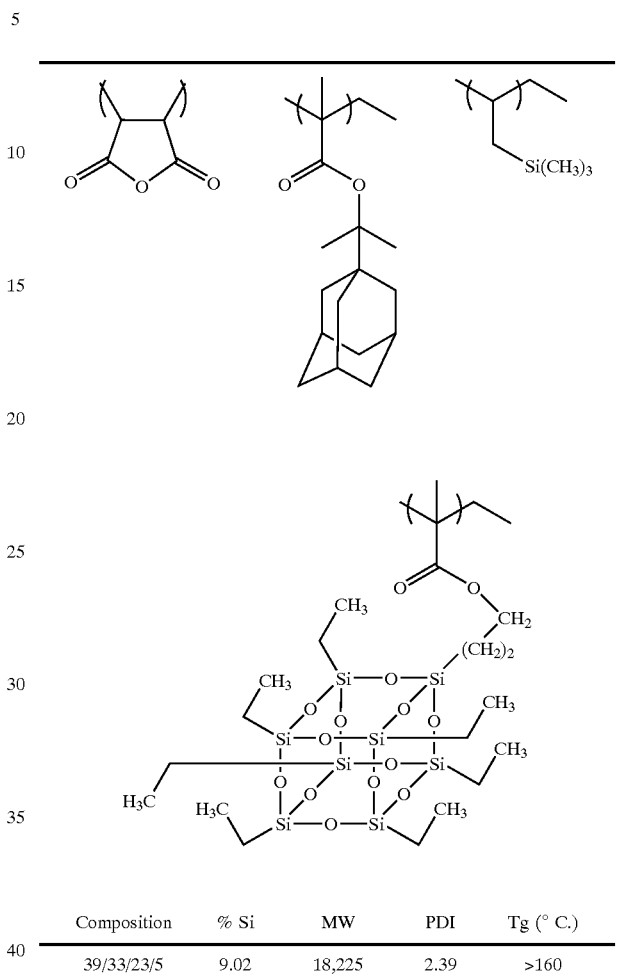

| Composition | % Si | MW | PDI | Tg (° C.) |
|---|---|---|---|---|
| 39/33/23/5 | 9.02 | 18,225 | 2.39 | >160 |

Polymer Examples 4

The mixture of monomers [maleic anhydride (1.81 g, 18.45 mmol), (hexahydro-2-oxo-3,5-methano-2H-cyclopenta[p]furan-6-yl)methacrylate (LMA) (2.01 g, 9.06 mmol), X-AdMA(2.38 g, 9.07 mmol) and methacrylEthyl-POSS (3.38 g, 4.53 mmol] was dissolved in THF (13 g, 40% solid) in a 100 mL three necked round bottom flask. The initiator Vazo® 67 (0.04 g, 0.41 mmol) dissolved in THF (2 g) was added to the mixture at 55° C. and was heated to 65° C. for 24 hours. No chain transfer agent was used. The polymer was processed as described in the general procedure.

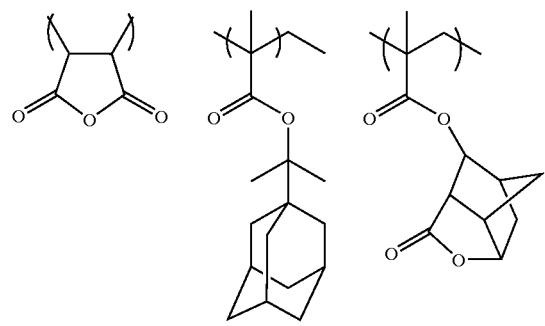

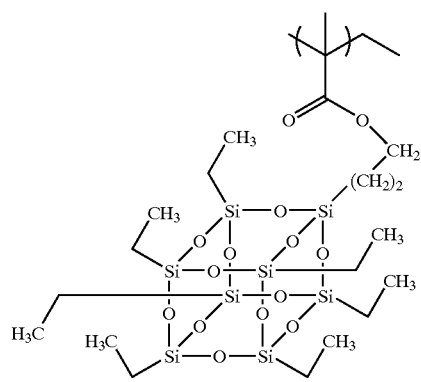

| Composition | % Si | MW | PDI | Tg (° C.) |
|---|---|---|---|---|
| 39/26/25/10 | 9.02 | 13,904 | 2.22 | 118 |

Polymer Example 5

The mixture of monomers [X-AdMA (4.63 g, 18.5 mmol), 2-methacryloxy-γ-butyrolactone (4.45 g, 26.2 mmol), DHMA (3.41 g, 14.3 mmol) and methacrylEthyl-POSS (7.48 g, 10.0 mmol)] and chain transfer agent 1-dodecanethiol (0.19 g, 0.9 mmol) were dissolved in THF (35 g) in a 100 mL three necked round bottom flask. The initiator dimethyl 2,2'-azobis(2-methylpropionate) (0.63 g, 3.3 mmol) dissolved in THF (2 g) was added to the mixture at 55° C. and was heated to 65° C. for 24 hours. The polymer was processed as described in the general procedure.

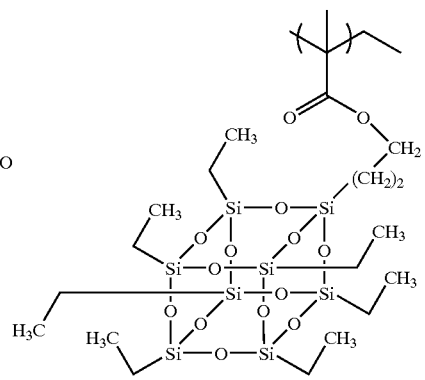

| Composition | % Si | MW | PDI | Tg (° C.) |
|---|---|---|---|---|
| 34/32/30/4 | 3.7 | 23,015 | 2.33 | — |

Polymer Examples 6

The mixture of monomers [LMA (6.43 g, 28.9 mmol), X-AdMA(3.15 g, 12.0 mmol) and methacrylEthyl-POSS (5.40 g, 7.23 mmol] and chain transfer agent 1-dodecanethiol (0.17 g, 0.8 mmol) were dissolved in THF (34 g) in a 100 mL three necked round bottom flask. The initiator Vazo® 67 (0.56 g, 2.9 mmol) dissolved in THF (2 g) was added to the mixture at 55° C. and was heated to 65° C. for 24 hours. No chain transfer agent was used. The polymer was processed as described in the general procedure.

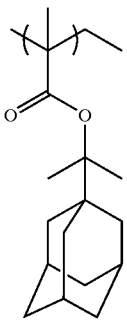 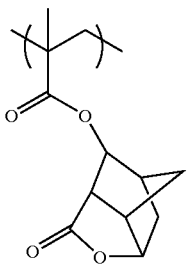 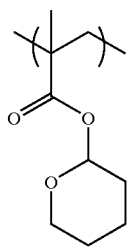 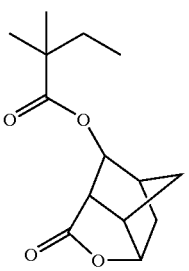

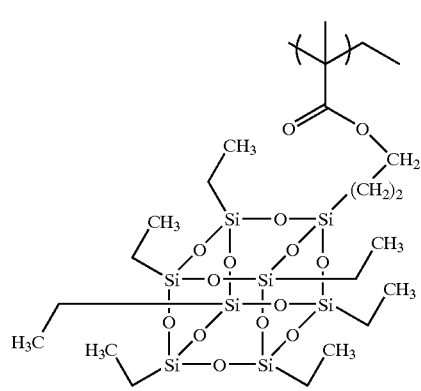

| Composition | % Si | MW | PDI | Tg (° C.) |
|---|---|---|---|---|
| 29/60/11 | 8.5 | 21,284 | 3.03 | — |

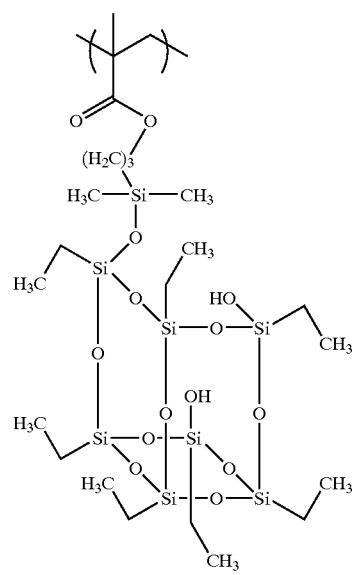

| Composition | % Si | MW | PDI | Tg (° C.) |
|---|---|---|---|---|
| 17/74/9 | 7.7 | 19,700 | 2.85 | — |

Polymer Example 7

The mixture of monomers [2-methacryloxy tetrahydropyran (0.88 g, 5.17 mmol), LMA (2.11 g, 9.49 mmol), and 3-[(7,14-dihydroxy-1,3,5,7,9,11,14-heptaethyltricyclo[7.3.3.15.11]heptasiloxan-3-yloxy)dimethylsilyl]propyl methacrylate (2.01 g, 2.58 mmol)] and chain transfer agent 1-dodecanethiol (0.12 g, 0.592 mmol) were dissolved in THF (28.57 g, 35% solid) in a 100 mL three necked round bottom flask. The initiator dimethyl 2,2'-azobis(2-methylpropionate) (0.41 g, 1.78 mmol) dissolved in THF (2 g) was added to the mixture at 55° C. and was heated to 65° C. for 24 hours. The polymer was precipitated in methanol (125 mL) and then processed as described in the general procedure.

Polymer Example 8

The mixture of monomers [X-AdMA (6.73 g, 25.7 mmol), 2-methacryloxy-γ-butyrolactone (5.36 g, 31.5 mmol), acrylic acid (0.16 g, 2.22 mmol) and methacrylEthyl-POSS (7.79 g, 10.4 mmol)] and chain transfer agent 1-dodecanethiol (0.19 g, 0.9 mmol) were dissolved in THF (32 g) in a 100 mL three necked round bottom flask. The initiator dimethyl 2,2'-azobis(2-methylpropionate) (0.67 g, 3.48 mmol) dissolved in THF (3 g) was added to the mixture at 55° C. and was heated to 65° C. for 21 hours. The polymer was precipitated in methanol (400 mL) and then processed as described in the general procedure.

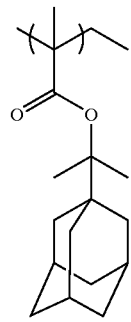
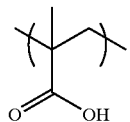
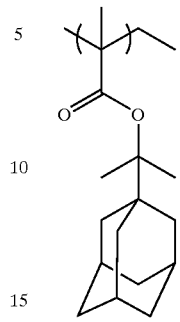
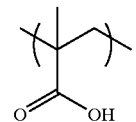
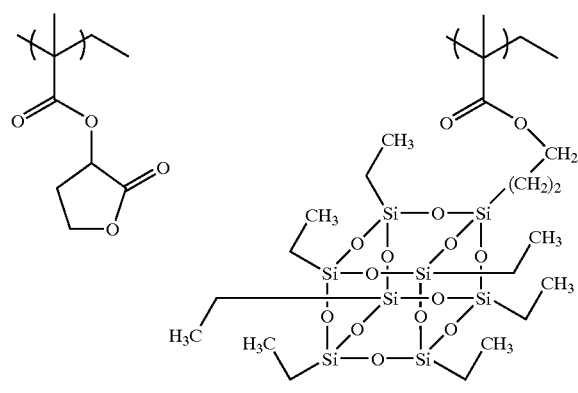
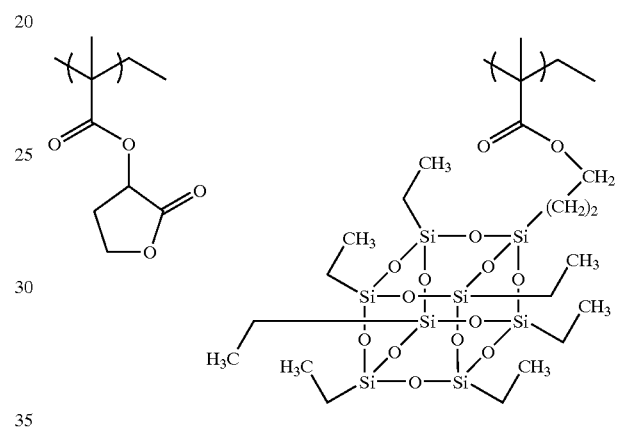

| Composition | % Si | MW | PDI | Tg (° C.) |
|---|---|---|---|---|
| 40/1/46/13 | 10.4 | 21,284 | 3.03 | 115 |

| Composition | % Si | MW | PDI | Tg (° C.) |
|---|---|---|---|---|
| 33/1/56/9 | 8.0 | 19,700 | 2.85 | — |

Polymer Example 9

Polymer Example 10

The mixture of monomers [X-AdMA (9.43 g, 35.9 mmol), 2-methacryloxy-γ-butyrolactone (11.20 g, 65.8 mmol), acrylic acid (0.44 g, 6.11 mmol) and methacrylEthyl-POSS (8.97 g, 12.0 mmol)] and chain transfer agent 1-dodecanethiol (0.34 g, 1.7 mmol) were dissolved in THF (50 g) in a 100 mL three necked round bottom flask. The initiator dimethyl 2,2'-azobis(2-methylpropionate) (1.15 g, 6.0 mmol) dissolved in THF (3 g) was added to the mixture at 55° C. and was heated to 65° C. for 21 hours. The polymer was precipitated in methanol (700 mL) and then processed as described in the general procedure.

The mixture of monomers [XAdMA (4.22 g, 16.1 mmol), 2-methacryloxy-γ-butyrolactone (4.58 g, 26.9 mmol), acrylic acid (0.19 g, 2.64 mmol) and methacrylEthyl-POSS (6.04 g, 8.1 mmol)] and chain transfer agent 1-dodecanethiol (0.16 g, 0.9 mmol) were dissolved in THF (27 g) and MEK (5 g) in a 100 mL three necked round bottom flask. The initiator dimethyl 2,2'-azobis(2-methylpropionate) (0.52 g, 2.7 mmol) dissolved in THF (1 g) was added to the mixture at 55° C. and was heated to 65° C. for 22 hours. The polymer was precipitated in methanol (500 mL) and then processed as described in the general procedure.

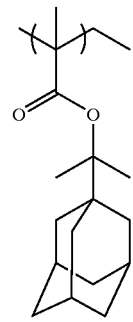 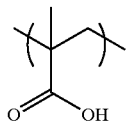

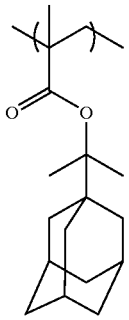 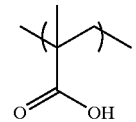

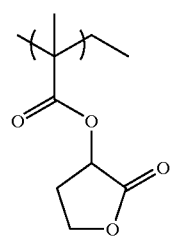 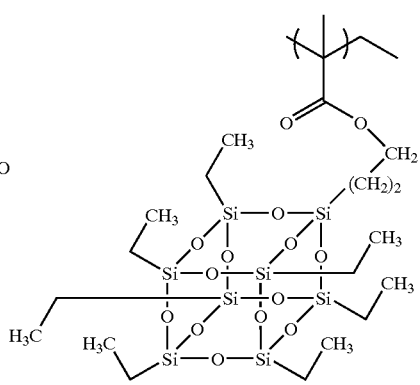

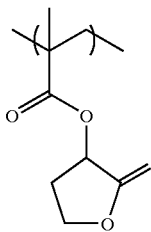 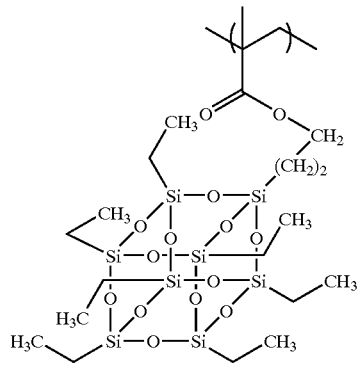

| Composition | % Si | MW | PDI | Tg (° C.) |
|---|---|---|---|---|
| 33/3/50/14 | 11.3 | 19,380 | 2.43 | 133 |

Polymer Example 11

| Composition | % Si | MW | PDI | Tg (° C.) |
|---|---|---|---|---|
| 27/13/47/13 | 11.5 | 24,947 | 2.58 | 132 |

Polymer Example 12

The mixture of monomers [X-AdMA (6.52 g, 8.7 mmol), 2-methacryloxy-γ-butyrolactone (4.55 g, 26.8 mmol), acrylic acid (0.61 g, 8.5 mmol) and methacrylEthyl-POSS (6.52 g, 8.7 mmol)] and chain transfer agent 1-dodecanethiol (0.19 g, 0.9 mmol) were dissolved in THF (28 g) and MEK (5 g) in a 100 mL three necked round bottom flask. The initiator dimethyl 2,2'-azobis(2-methylpropionate) (0.63 g, 3.3 mmol) dissolved in THF (1 g) was added to the mixture at 55° C. and was heated to 65° C. for 22 hours. The polymer was precipitated in methanol (900 mL) and then processed as described in the general procedure.

The mixture of monomers [X-AdMA (3.36 g, 12.8 mmol), 2-methacryloxy-γ-butyrolactone (4.54 g, 26.7 mmol), 4-[2-(1,1,1,3,3,3-hexafluoro-2-hydroxy)-propyl]styrene (0.97 g, 3.6 mmol) and methacrylEthyl-POSS (6.13 g, 8.2 mmol)] and chain transfer agent 1-dodecanethiol (0.19 g, 0.9 mmol) were dissolved in THF (28 g) and MEK (5 g) in a 100 mL three necked round bottom flask. The initiator dimethyl 2,2'-azobis(2-methylpropionate) (0.62 g, 3.2 mmol) dissolved in THF (2 g) was added to the mixture at 55° C. and was heated to 65° C. for 22 hours. The polymer was precipitated in methanol (900 mL) and then processed as described in the general procedure.

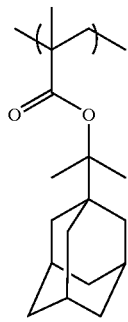 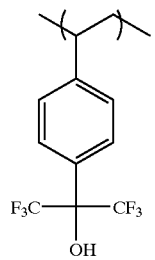 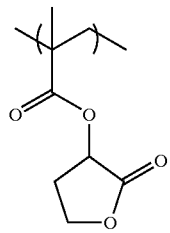 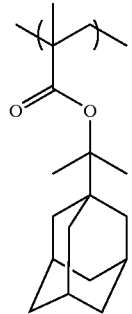 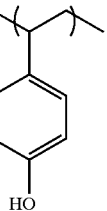 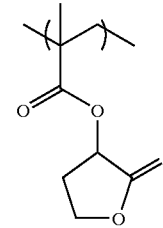

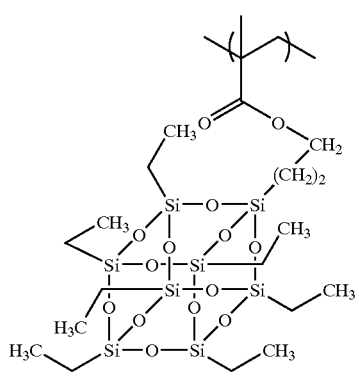

| Composition | % Si | MW | PDI | Tg (° C.) |
|---|---|---|---|---|
| 27/6/54/13 | 10.6 | 19,928 | 2.72 | 144 |

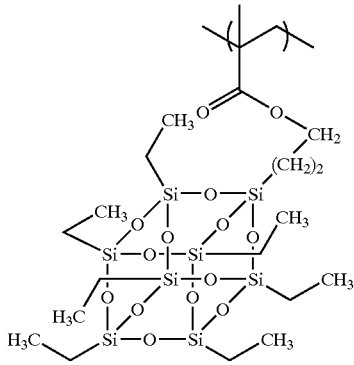

| Composition | % Si | MW | PDI | Tg (° C.) |
|---|---|---|---|---|
| 29/5/52/14 | 11.4 | 20,711 | 2.84 | — |

Polymer Example 13

The mixture of monomers [X-AdMA (3.50 g, 13.3 mmol), 2-methacryloxy-γ-butyrolactone (4.75 g, 27.9 mmol), 4-hydroxystyrene (0.46 g, 3.8 mmol) and methacrylEthyl-POSS (6.36 g, 8.5 mmol)] and chain transfer agent 1-dodecanethiol (0.18 g, 0.9 mmol) were dissolved in THF (33 g) and MEK (5 g) in a 100 mL three necked round bottom flask. The initiator dimethyl 2,2'-azobis(2-methylpropionate) (0.62 g, 3.2 mmol) dissolved in THF (1 g) was added to the mixture at 55° C. and was heated to 65° C. for 22 hours. The polymer was precipitated in methanol (2 L) and then processed as described in the general procedure.

Polymer Example 14

The mixture of monomers [maleic anhydride (25.68 g, 26.2 mmol), allyltrimethylsilane (29.92 g, 26.2 mmol), tert-butylacrylate (32.54 g, 25.4 mmol) and methacrylEthyl-POSS (11.86 g, 1.6 mmol)] was dissolved in THF (150 g, 40% solid) in a 500 mL three necked round bottom flask. The initiator VAZO® 67 (0.503 g, 2.61 mmol) dissolved in THF (2 g) was added to the mixture at 55° C. and was heated to 65° C. for 24 h. The reaction mixture was then cooled to room temperature and the solvent was removed under vacuum. The solid polymer was triturated with 300 ml of hexanes for 1 h and filtered. The process was repeated twice to remove residual monomers. After filtration, the solid was dried at 60° C. for 24 h under vacuum.

Polymer Example 16

The mixture of monomers [maleic anhydride (23.38 g, 23.8 mmol), allyltrimethylsilane (27.24 g, 23.8 mmol), tert-butylacrylate (27.78 g, 21.7 mmol) and methacrylEthyl-POSS (21.60 g, 2.9 mmol)] was dissolved in THF (150 g, 40% solid) in a 500 mL three necked round bottom flask. The initiator VAZO® 67 (0.458 g, 2.38 mmol) dissolved in THF (2 g) was added to the mixture at 55° C. and was heated to 65° C. for 24 h. The polymer was processed as described in Polymer Example 14.

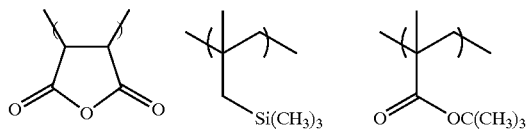

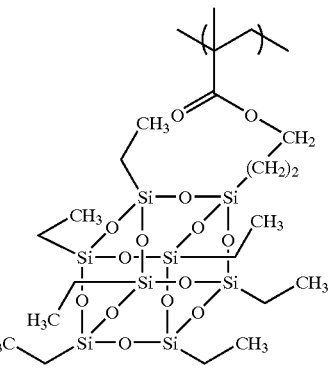

| Composition | % Si | MW | PDI | Tg (° C.) |
|---|---|---|---|---|
| 37/31/30/2 | 10.9 | 10,023 | 2.15 | 111 |

Polymer Example 15

The mixture of monomers [maleic anhydride (24.47 g, 25.0 mmol) allyltrimethylsilane (28.52 g, 25.0 mmol) tert-butylacrylate (30.05 g, 234 mmol) and methacrylEthyl-POSS (16.96 g, 2.3 mmol)] was dissolved in THF (150 g, 40% solid) in a 500 mL three necked round bottom flask. The initiator VAZO® 67 (0.480 g, 2.49 mmol) dissolved in THF (2 g) was added to the mixture at 55° C. and was heated to 65° C. for 24 h. The polymer was processed as described in Polymer Example 14.

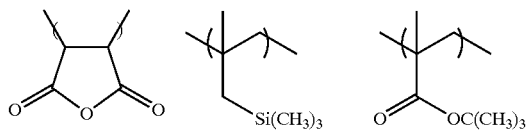

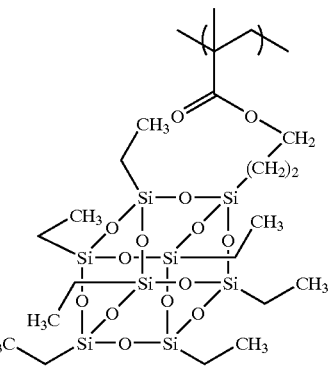

| Composition | % Si | MW | PDI | Tg (° C.) |
|---|---|---|---|---|
| 39/29/29/3 | 12.1 | 11,245 | 2.34 | 110 |

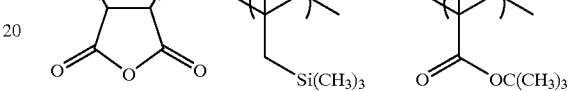

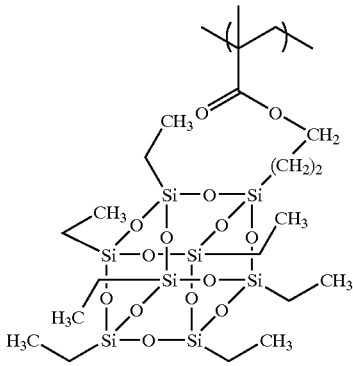

| Composition | % Si | MW | PDI | Tg (° C.) |
|---|---|---|---|---|
| 40/29/27/4 | 13.0 | 10,069 | 2.15 | 109 |

Polymer Example 17

The mixture of monomers [maleic anhydride (22.38 g, 22.8 mmol), allyltrimethylsilane (26.06 g, 22.8 mmol), tert-butylacrylate (25.71 g, 20.1 mmol) and methacrylEthyl-POSS (25.86 g, 3.5 mmol)] was dissolved in THF (150 g, 40% solid) in a 500 mL three neck round bottom flask. The initiator VAZO® 67 (0.439 g, 2.28 mmol) dissolved in THF (2 g) was added to the mixture at 55° C. and was heated to 65° C. for 24 h. The polymer was processed as described in Polymer Example 14.

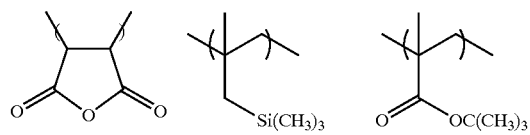

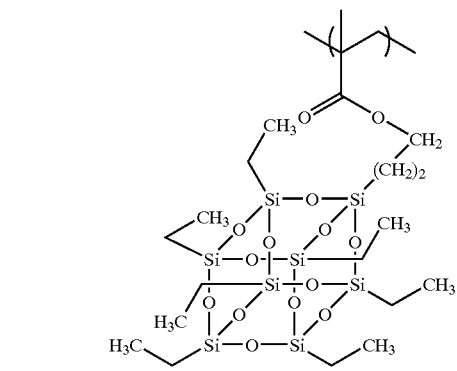

| Composition | % Si | MW | PDI | Tg (° C.) |
|---|---|---|---|---|
| 42/26/26/5 | 13.8 | 13,146 | 2.69 | 110 |

Polymer Example 18

The mixture of monomers [maleic anhydride (21.46 g, 21.9 mmol), allyltrimethylsilane (25.01 g, 21.9 mmol), tert-butylacrylate (23.8 g, 18.6 mmol) and methacrylEthyl-POSS (29.73 g, 4.0 mmol)] was dissolved in THF (150 g, 40% solid) in a 500 mL three neck round bottom flask. The initiator VAZO® 67 (0.421 g, 2.18 mmol) dissolved in THF (2 g) was added to the mixture at 55° C. and was heated to 65° C. for 24 h. The polymer was processed as described in Polymer Example 14.

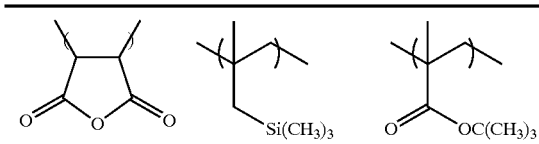

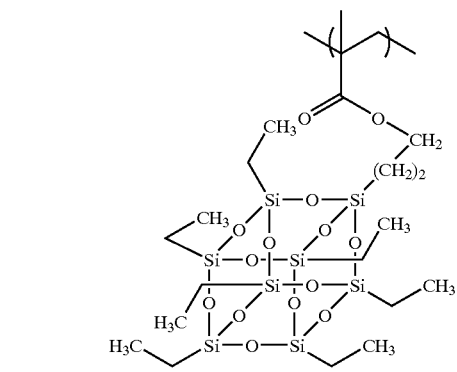

| Composition | % Si | MW | PDI | Tg (° C.) |
|---|---|---|---|---|
| 38/30/27/6 | 14.6 | 14,518 | 3.34 | 108 |

Polymer Example 19

The mixture of monomers [maleic anhydride (20.61 g, 21.0 mmol), allyltrimethylsilane (24.02 g, 21.0 mmol), tert-butylacrylate (22.04 g, 17.2 mmol) and methacrylEthyl-POSS (33.32 g, 4.5 mmol)] was dissolved in THF (150 g, 40% solid) in a 500 mL three neck round bottom flask. The initiator VAZO® 67 (0.404 g, 2.1 mmol) dissolved in THF (2 g) was added to the mixture at 55° C. and was heated to 65° C. for 24 h. The polymer was processed as described in Polymer Example 14.

| Composition | % Si | MW | PDI | Tg (° C.) |
|---|---|---|---|---|
| 39/30/23/7 | 15.5 | 15,104 | 3.34 | 110 |

Formulation Example 1 (Photoresist Composition)

A photoresist composition was prepared by adding of Polymer Example 1 (7.252 g), toluenediphenylsulfonium perfluorooctanesulfonate PAG (TDPS PFOS, 0.40 g), 1,8-diazabicyclo[5.4.0]undec-7-ene (DBU, 0.03 g) as quencher and propylene glycol methyl ether acetate (PGMEA, 92.05 g) as solvent. The resulting mixture was filtered through a 0.1 μm PTFE filter.

Formulation Example 2 (Photoresist Composition)

A photoresist composition was prepared by adding of Polymer Example 2 (7.252 g), toluenediphenylsulfonium perfluorooctanesulfonate PAG (TDPS PFOS, 0.40 g), 1,8-diazabicyclo[5.4.0]undec-7-ene (DBU, 0.03 g) as quencher and propylene glycol methyl ether acetate (PGMEA, 92.05 g) as solvent. The resulting mixture was filtered through a 0.1 μm PTFE filter.

Formulation Example 3 (Photoresist Composition)

A photoresist composition was prepared by adding of Polymer Example 3 (7.252 g), toluenediphenylsulfonium perfluorooctanesulfonate PAG (TDPS PFOS, 0.40 g), 1,8-diazabicyclo[5.4.0]undec-7-ene (DBU, 0.03 g) as quencher and propylene glycol methyl ether acetate (PGMEA, 92.05 g) as solvent. The resulting mixture was filtered through a 0.1 μm PTFE filter.

Formulation Example 4 (Photoresist Composition)

A photoresist composition was prepared by adding of Polymer Example 4 (7.252 g), toluenediphenylsulfonium perfluoro octanesulfonate PAG (TDPS PFOS, 0.40 g), 1,8- diazabicyclo[5.4.0]undec-7-ene (DBU, 0.03 g) as quencher and propylene glycol methyl ether acetate (PGMEA, 92.05 g) as solvent. The resulting mixture was filtered through a 0.1 µm PTFE filter.

Formulation Example 5 (Photoresist Composition)

A photoresist composition was prepared by adding of Polymer Example 4 (8.41 g), tris-tert-butyl phenylsulfonium nonaflate (TBPS Nonaflate, 0.95 g), 1,8-diazabicyclo[5.4.0]undec-7-ene (DBU, 0.07 g) as quencher and propylene glycol methyl ether acetate (PGMEA, 90.57 g) as solvent. The resulting mixture was filtered through a 0.1 µm PTFE filter.

Formulation Example 6 (Photoresist Composition)

A photoresist composition was prepared by adding of Polymer Example 5 (7.252 g), toluenediphenylsulfonium perfluoro octanesulfonate PAG (TDPS PFOS, 0.40 g), 1,8-diazabicyclo[5.4.0]undec-7-ene (DBU, 0.03 g) as quencher and propylene glycol methyl ether acetate (PGMEA, 92.05 g) as solvent. The resulting mixture was filtered through a 0.1 µm PTFE filter.

Formulation Example 7 (Photoresist Composition)

A photoresist composition was prepared by adding of Polymer Example 6 (7.252 g), toluenediphenylsulfonium perfluoro octanesulfonate PAG (TDPS PFOS, 0.40 g), 1,8-diazabicyclo[5.4.0]undec-7-ene (DBU, 0.03 g) as quencher and propylene glycol methyl ether acetate (PGMEA, 92.05 g) as solvent. The resulting mixture was filtered through a 0.1 µm PTFE filter.

Formulation Example 8 (Photoresist Composition)

A photoresist composition was prepared by adding of Polymer Example 7 (7.252 g), toluenediphenylsulfonium perfluoro octanesulfonate PAG (TDPS PFOS, 0.40 g), 1,8-diazabicyclo[5.4.0]undec-7-ene (DBU, 0.03 g) as quencher and propylene glycol methyl ether acetate (PGMEA, 92.05 g) as solvent. The resulting mixture was filtered through a 0.1 µm PTFE filter.

Formulation Example 9 (Photoresist Composition)

A photoresist composition was prepared by adding of Polymer Example 8 (7.252 g), toluenediphenylsulfonium perfluoro octanesulfonate PAG (TDPS PFOS, 0.40 g), 1,8-diazabicyclo[5.4.0]undec-7-ene (DBU, 0.03 g) as quencher and propylene glycol methyl ether acetate (PGMEA, 92.05 g) as solvent. The resulting mixture was filtered through a 0.1 µm PTFE filter.

Formulation Example 10 (Photoresist Composition)

A photoresist composition was prepared by adding of Polymer Example 9 (7.252 g), toluenediphenylsulfonium perfluoro octanesulfonate PAG (TDPS PFOS, 0.40 g), 1,8-diazabicyclo[5.4.0]undec-7-ene (DBU, 0.03 g) as quencher and propylene glycol methyl ether acetate (PGMEA, 92.05 g) as solvent. The resulting mixture was filtered through a 0.1 µm PTFE filter.

Formulation Example 11 (Photoresist Composition)

A photoresist composition was prepared by adding of Polymer Example 10 (7.252 g), toluenediphenylsulfonium perfluoro octanesulfonate PAG (TDPS PFOS, 0.40 g), 1,8-diazabicyclo[5.4.0]undec-7-ene (DBU, 0.03 g) as quencher and propylene glycol methyl ether acetate (PGMEA, 92.05 g) as solvent. The resulting mixture was filtered through a 0.1 µm PTFE filter.

Formulation Example 12 (Photoresist Composition)

A photoresist composition was prepared by adding of Polymer Example 11 (7.252 g), toluenediphenylsulfonium perfluoro octanesulfonate PAG (TDPS PFOS, 0.40 g), 1,8-diazabicyclo[5.4.0]undec-7-ene (DBU, 0.03 g) as quencher and propylene glycol methyl ether acetate (PGMEA, 92.05 g) as solvent. The resulting mixture was filtered through a 0.1 µm PTFE filter.

Formulation Example 13 (Photoresist Composition)

A photoresist composition was prepared by adding of Polymer Example 12 (7.252 g), toluenediphenylsulfonium perfluoro octanesulfonate PAG (TDPS PFOS, 0.40 g), 1,8-diazabicyclo[5.4.0]undec-7-ene (DBU, 0.03 g) as quencher and propylene glycol methyl ether acetate (PGMEA, 92.05 g) as solvent. The resulting mixture was filtered through a 0.1 µm PTFE filter.

Formulation Example 14 (Photoresist Composition)

A photoresist composition was prepared by adding of Polymer Example 13 (7.252 g), toluenediphenylsulfonium perfluoro octanesulfonate PAG (TDPS PFOS, 0.40 g), 1,8-diazabicyclo[5.4.0]undec-7-ene (DBU, 0.03 g) as quencher and propylene glycol methyl ether acetate (PGMEA, 92.05 g) as solvent. The resulting mixture was filtered through a 0.1 µm PTFE filter.

Formulation Example 15 (Photoresist Composition)

A photoresist composition was prepared by adding of Polymer Example 2 (3.0), toluenediphenylsulfonium perfluorooctanesulfonate PAG (TDPS PFOS, 0.092 g), 1,8-diazabicyclo[5.4.0]undec-7-ene (DBU, 0.0058 g) as quencher and propylene glycol methyl ether acetate (PGMEA, 25.22 g) as solvent. The resulting mixture was filtered through a 0.1 µm PTFE filter.

Formulation Example 16 (Photoresist Composition)

A photoresist composition was prepared by adding of 7.44 g of polymer from Polymer Example 14, 0.52 g of toluenediphenylsulfonium perfluorooctanesulfonate PAG (TDPS PFOS), 0.04 g of 1,8-diazabicyclo[5.4.0]undec-7-ene (DBU) as quencher and 42.0 g of propylene glycol methyl ether acetate (PGMEA) and 42.0 g of 2-heptanone as solvent. The resulting mixture was filtered through a 0.1 µm Teflon filter.

Formulation Example 17 (Photoresist Composition)

A photoresist composition was prepared by adding of 7.44 g of polymer from Polymer Example 15, 0.52 g of toluenediphenylsulfonium perfluorooctanesulfonate PAG (TDPS PFOS), 0.04 g of 1,8-diazabicyclo[5.4.0]undec-7-ene (DBU) as quencher and 42.0 g of propylene glycol methyl ether acetate (PGMEA) and 42.0 g of 2-heptanone as solvent. The resulting mixture was filtered through a 0.1 µm Teflon filter.

Formulation Example 18 (Photoresist Composition)

A photoresist composition was prepared by adding of 7.44 g of polymer from Polymer Example 16, 0.52 g of toluenediphenylsulfonium perfluorooctanesulfonate PAG (TDPS PFOS), 0.04 g of 1,8-diazabicyclo[5.4.0]undec-7-ene (DBU) as quencher and 42.0 g of propylene glycol methyl ether acetate (PGMEA) and 42.0 g of 2-heptanone as solvent. The resulting mixture was filtered through a 0.1 μm Teflon filter.

Formulation Example 19 (Photoresist Composition)

A photoresist composition was prepared by adding of 7.44 g of polymer from Polymer Example 17, 0.52 g of toluene-diphenylsulfonium perfluorooctanesulfonate PAG (TDPS PFOS), 0.04 g of 1,8-diazabicyclo[5.4.0]undec-7-ene (DBU) as quencher and 42.0 g of propylene glycol methyl ether acetate (PGMEA) and 42.0 g of 2-heptanone as solvent. The resulting mixture was filtered through a 0.1 μm Teflon filter.

Formulation Example 20 (Photoresist Composition)

A photoresist composition was prepared by adding of 7.44 g of polymer from Polymer Example 18, 0.52 g of toluene-diphenylsulfonium perfluorooctanesulfonate PAG (TDPS PFOS), 0.04 g of 1,8-diazabicyclo[5.4.0]undec-7-ene (DBU) as quencher and 42.0 g of propylene glycol methyl ether acetate (PGMEA) and 42.0 g of 2-heptanone as solvent. The resulting mixture was filtered through a 0.1 μm Teflon filter.

Formulation Example 21 (Photoresist Composition)

A photoresist composition was prepared by adding of 7.44 g of polymer from Polymer Example 19, 0.52 g of toluene-diphenylsulfonium perfluorooctanesulfonate PAG (TDPS PFOS), 0.04 g of 1,8-diazabicyclo[5.4.0]undec-7-ene (DBU) as quencher and 42.0 g of propylene glycol methyl ether acetate (PGMEA) and 42.0 g of 2-heptanone as solvent. The resulting mixture was filtered through a 0.1 μm Teflon filter.

Formulation Example 22 (Photoresist Composition)

A photoresist composition was prepared by adding of 7.15 g of polymer from Polymer Example 14, 0.80 g of toluene-diphenylsulfonium perfluorooctanesulfonate PAG (TDPS PFOS), 0.05 g of 1,8-diazabicyclo[5.4.0]undec-7-ene (DBU) as quencher and 42.0 g of propylene glycol methyl ether acetate (PGMEA) and 42.0 g of 2-heptanone as solvent. The resulting mixture was filtered through a 0.1 μm Teflon filter.

Formulation Example 23 (Photoresist Composition)

A photoresist composition was prepared by adding of 7.15 g of polymer from Polymer Example 15, 0.80 g of toluene-diphenylsulfonium perfluorooctanesulfonate PAG (TDPS PFOS), 0.05 g of 1,8-diazabicyclo[5.4.0]undec-7-ene (DBU) as quencher and 42.0 g of propylene glycol methyl ether acetate (PGMEA) and 42.0 g of 2-heptanone as solvent. The resulting mixture was filtered through a 0.1 μm Teflon filter.

Formulation Example 24 (Photoresist Composition)

A photoresist composition was prepared by adding of 7.15 g of polymer from Polymer Example 16, 0.80 g of toluene-diphenylsulfonium perfluorooctanesulfonate PAG (TDPS PFOS), 0.05 g of 1,8-diazabicyclo[5.4.0]undec-7-ene (DBU) as quencher and 42.0 g of propylene glycol methyl ether acetate (PGMEA) and 42.0 g of 2-heptanone as solvent. The resulting mixture was filtered through a 0.1 μm Teflon filter.

Formulation Example 25 (Photoresist Composition)

A photoresist composition was prepared by adding of 7.15 g of polymer from Polymer Example 17, 0.80 g of toluene-diphenylsulfonium perfluorooctanesulfonate PAG (TDPS PFOS), 0.05 g of 1,8-diazabicyclo[5.4.0]undec-7-ene (DBU) as quencher and 42.0 g of propylene glycol methyl ether acetate (PGMEA) and 42.0 g of 2-heptanone as solvent. The resulting mixture was filtered through a 0.1 μm Teflon filter.

Formulation Example 26 (Photoresist Composition)

A photoresist composition was prepared by adding of 7.15 g of polymer from Polymer Example 18, 0.80 g of toluene-diphenylsulfonium perfluorooctanesulfonate PAG (TDPS PFOS), 0.05 g of 1,8-diazabicyclo[5.4.0]undec-7-ene (DBU) as quencher and 42.0 g of propylene glycol methyl ether acetate (PGMEA) and 42.0 g of 2-heptanone as solvent. The resulting mixture was filtered through a 0.1 μm Teflon filter.

Formulation Example 27 (Photoresist Composition)

A photoresist composition was prepared by adding of 7.15 g of polymer from Polymer Example 19, 0.80 g of toluene-diphenylsulfonium perfluorooctanesulfonate PAG (TDPS PFOS), 0.05 g of 1,8-diazabicyclo[5.4.0]undec-7-ene (DBU) as quencher and 42.0 g of propylene glycol methyl ether acetate (PGMEA) and 42.0 g of 2-heptanone as solvent. The resulting mixture was filtered through a 0.1 μm Teflon filter.

General Lithographic Procedure 1 (193 nm Bilayer Process)

Two ml of a solution of a 193 nm TCU (thermally cured under layer) (similar to that described in Example 2 in U.S. Pat. No. 6,323, 287) was dispensed onto a silicon wafer, spin coated and cured at 205° C. for 70 s to form a uniform cross linked layer with thickness of about 4000 Å. After cooling to room temperature, approximately 1 mL photoresist of the invention was applied on top of the TCU layer, spin coated and baked at 125° C. for 60 s to yield a uniform and homogeneous film with a thickness of about 1500 Å. The wafer was exposed through a binary reticle having line/space patterns of varying sizes using a 193 nm ISI Microstep Exposure tool with NA=0.6 using conventional illumination. The exposed wafer was baked at 115° C. for 60 s. The images were developed using a stream of 0.262N aqueous tetramethylammonium hydroxide developer solution (OPD-262, available from Arch Chemical Company) for 10 seconds, followed by development for 55 seconds using the puddle of accumulated developer. Photospeed and resolution were determined for line/space or contact hole patterns using a scanning electron microscope.

Lithographic Example 1

Formulation 4 was used to generate line space patterns using General Lithographic Procedure 1 described above. Dense line/space patterns were produced uniformly across the wafer with a vertical profile. The TCU layer was dry developed, by an $O_2$ RIE plasma process for about 30 s resulting in pattern transfer of the image of the top, Si containing layer. Clean and vertical 130 nm line/space patterns were produced with high aspect ratio.

Lithographic Examples 2–12

Lithographic Examples 2–12 were carried out using the General Lithographic Procedure described above. The formulations tested lithographically and the lithographic results are listed in Table 2

TABLE 2

Lithographic Results

| # | Formulation | Sensitivity (dose to clear (mJ/cm$^2$)) | Resolution of line/space or contact hole patterns (nm) NA = 0.6, Binary mask, conventional illumination |
|---|---|---|---|
| 2 | Formulation 1 | 13.8 | 140 l/s |
| 3 | Formulation 2 | 5.6 | 130 l/s |
| 4 | Formulation 4 | 7.9 | 125 l/s |
| 5 | Formulation 5 | 7.9 | 125 l/s |
| 6 | Formulation 10 | 13.9 | 130 l/s |
| 7 | Formulation 11 | 10.8 | 115 l/s |
| 8 | Formulation 12 | 11.4 | 130 l/s |
| 9 | Formulation 13 | 5.6 | 150 l/s |
| 10 | Formulation 15 | 37.4 | 130 l/s |
| 11 | Formulation 16 | 9.5 | 110 l/s |
| 12 | Formulation 17 | 10.0 | 110 l/s |
| 13 | Formulation 18 | 11.0 | 110 l/s |
| 14 | Formulation 19 | 10.1 | 110 l/s |
| 15 | Formulation 20 | 10.5 | 110 l/s |
| 16 | Formulation 21 | — | No Image |
| 17 | Formulation 17 | 12.0 | 150 C/H (Contact Hole) |
| 18 | Formulation 18 | 11.2 | 150 C/H |
| 19 | Formulation 20 | 11.8 | 150 C/H |

General Lithographic Procedure 2: 248 nm Bi-Layer Process

Two ml of a 248 nm TCU (thermally cured under layer) (similar to that described in Undercoat Formulation 1 in U.S. Pat. No. 6,610,808) were dispensed, spin coated and cured at 205° C. for 70 s on Si wafer to form a uniform cross-linked layer with thickness about 5000 Å. After cooling to room temperature, 1 ml of the photoresist of the invention was applied on top of the TCU layer, spin coated and baked at 110° C. for 60 s to yield a uniform and homogeneous film with a thickness of about 1500 Å. The coated wafer was then exposed through a binary reticle having line/space patterns of various sizes using an ISI 248 nm Stepper. The exposed wafer was baked at 115° C. for 60 s. The images were developed using a stream of 0.262 N aqueous tetramethylammonium hydroxide developer solution (OPD-262, available from Arch Chemical Company) for 10 seconds, followed by development for 55 seconds using the puddle of accumulated developer. Photospeed and resolution were determined for line/space patterns using a scanning electron microscope.

Lithographic Example 20

Formulation 24 was used to generate line space patterns using General Lithographic Procedure 2 (248 nm Bilayer Process) described above. 140 nm Dense line/space patterns were produced uniformly across the wafer with a vertical profile. The TCU layer was dry developed, by an O$_2$ RIE plasma process for about 30 s resulting in pattern transfer of the image of the top, Si containing layer. Clean and vertical 140 nm line/space patterns were produced with high aspect ratio.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:
1. A copolymer comprising:
at least one Structure (I) first repeating unit comprising one or more repeating units selected from the group consisting of units represented by Structure (IA), Structure (IB) and Structure (1C)

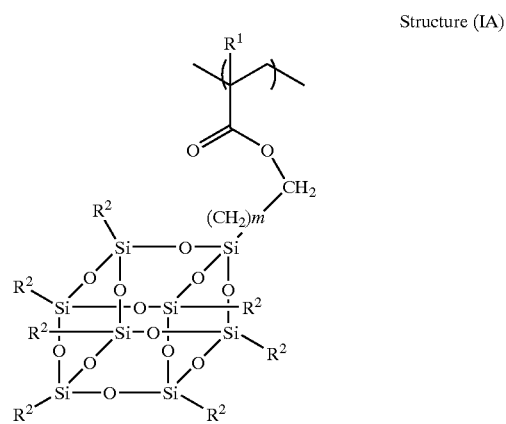

Structure (IA)

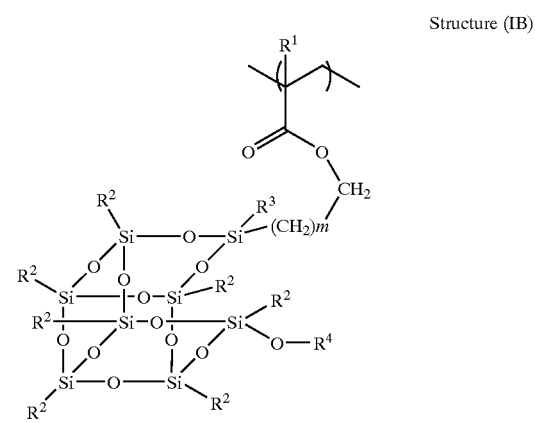

Structure (IB)

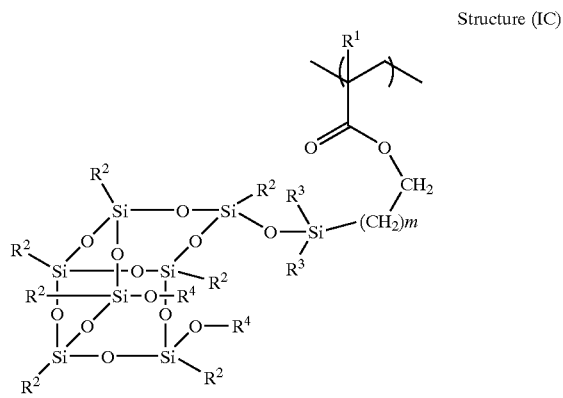

Structure (IC)

wherein each R$^1$ is independently a selected from the group consisting of hydrogen atom or a methyl group; R$^3$ is selected from the group consisting of a linear, branched and cyclic alkyl or alicyclic group having 1 to 20 carbon atoms; m is an integer from about 2 to about 10; each R$^4$ is independently be selected from the group consisting of H and Structure (II), Structure (II)

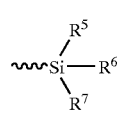

wherein $R^5$, $R^6$ and $R^7$ are each independently selected from the group consisting of a linear, branched or cyclic alkyl, alicyclic and fluoroalkyl group having 1 to 20 carbon atoms; and each $R^2$ is independently selected from the group consisting of (a) a linear, branched or cyclic alkyl unsubstituted or substituted alicyclic group, having 1 to 20 carbon atoms;

(b) A linear, branched or cyclic fluoroalkyl or fluorine substituted alicyclic group having 1 to 20 carbon atoms; and (c) a polar group selected from the group consisting of (1) $(CH_2)_n—OR^8$, where n is an integer from about 2 to about 10 and $R^8$ is selected from the group consisting of H, $R^3$ group and α-alkoxy alkyl group; $R^3$ is a linear, branched or cyclic alkyl or alicyclic group having 1 to 20 carbon atoms;

(2) $(CH_2)_n—(C=O)—OR^9$, where n is an integer from about 2 to about 10 and $R^9$ is selected from the group consisting of H, $R^3$ group and an acid sensitive protecting group; $R^3$ is a linear, branched or cyclic alkyl or alicyclic group having 1 to 20 carbon atoms;

(3) $(CH_2)_n—C(CF_3)R^{10}—OR^{11}$, where n is an integer from about 2 to about 10 and $R^{10}$ is selected from the group consisting of H, fluoromethyl, difluoromethyl, and trifluoromethyl and $R^{11}$ is selected from the group consisting of H and an $R^3$ alkyl group; and (4) $(CH_2)_n—O—(C=O)R^3$, where n is an integer from about 2 to about 10; and $R^3$ is a linear, branched or cyclic alkyl or alicyclic group having 1 to 20 carbon atoms; and a second repeating unit represented by Structure (III)

Structure (III)

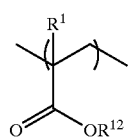

wherein $R^1$ has the same meaning as defined above and $R^{12}$ is an acid labile group, with the proviso that when Structure (IA) is present in the copolymer and $R^{12}$ is t-Bu, an additional repeating unit having Structure (IV), or Structure (VI), or a repeating unit derived from an ethylenically unsaturated, polymerizable silicon compound different from Structures (IA), (IB), and (IC), as defined hereinafter, must be present, and where Structure (IV) is as follows:

Structure (IV)

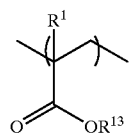

wherein $R^1$ has the same meaning as defined above and $R^{13}$ is selected from the group consisting of the following structures (Va–Vg)

(Va)

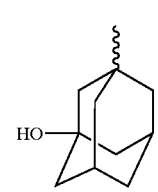

(Vb)

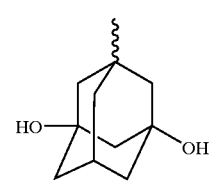

(Vc)

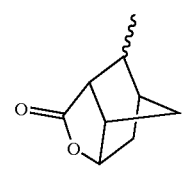

(Vd)

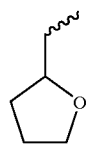

(Ve)

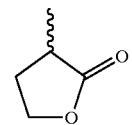

(Vf)

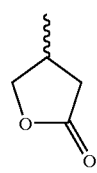

(Vg)

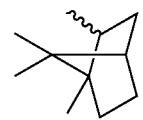

and Structure (VI) is

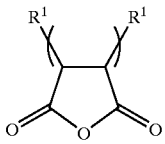

Structure (VI)

where R¹ has the meaning as defined above.

2. A copolymer of claim 1 additionally comprising at least one additional repeating unit selected from the group consisting of Structures (IV) and (VI)

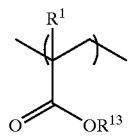

Structure (IV)

wherein R¹ has the same meaning as defined above in claim 1 and R¹³ is selected from the following structures (Va–Vg)

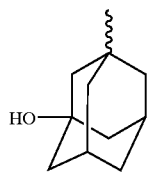
(Va)

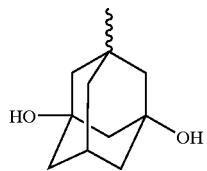
(Vb)

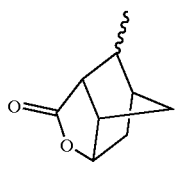
(Vc)

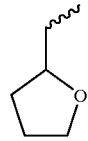
(Vd)

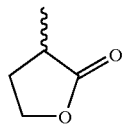
(Ve)

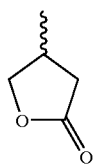
(Vf)

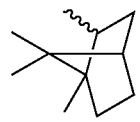
(Vg)

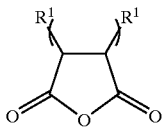
Structure (VI)

and R¹ has the meaning as defined above in claim 1.

3. A copolymer of claim 2 wherein the repeating unit represented by Structures (IA), (IB) or (IC) is from about 5 molar % to about 25 molar % of all repeating units constituting the copolymer; the repeating unit represented by Structure (III) is from about 20 molar % to about 50 molar % of all repeating units constituting the copolymer; the repeating unit represented by Structure (IV) when present in the copolymer is from about 20 molar % to about 50 molar % of all repeating units constituting the copolymer; and the repeating unit represented by Structure (VI) when present in the copolymer is from about 1 molar % to about 40 molar % of all repeating units constituting the copolymer.

4. A copolymer of claim 1 additionally comprising a repeating unit derived from a ethylenically unsaturated, polymerizable silicon compound different from Structures (IA), (IB), and (IC).

5. A copolymer of claim 4 wherein the repeating unit derived from an ethylenically unsaturated, polymerizable silicon compound different from Structures (IA), (IB), and (IC) is from about 20 molar % to about 50 molar % of all repeating units constituting the copolymer.

6. A copolymer of claim 2 additionally comprising a repeating unit derived from a ethylenically unsaturated, polymerizable silicon compound different from Structures (IA), (IB), and (IC).

7. A copolymer of claim 2 comprising repeating units of Structure (I), Structure (III) and Structure (VI).

8. A copolymer of claim 7 additionally comprising at least one repeating unit derived from an ethylenically unsaturated, polymerizable silicon compound different from Structures (IA), (IB), and (IC).

9. A copolymer of claim 8 wherein the repeating unit derived from an ethylenically unsaturated, polymerizable silicon compound different from Structures (IA), (IB), and (IC) is from about 15 molar % to about 45 molar % of all repeating units constituting the copolymer.

10. The copolymer of claim 1 having a weight average molecular weight, in terms of polystyrene, of from about 7,000 to about 30,000.

11. The copolymer of claim 1 wherein the level of silicon in the copolymer is from about 4 to about 15% by weight.

12. The copolymer of claim 2 wherein the level of silicon in the copolymer is from about 4 to about 15% by weight.

13. The copolymer of claim 1 wherein R³ is selected from the group consisting of methyl, ethyl, propyl, isopropyl, n-butyl, sec-butyl, tert-butyl, cyclohexyl, cyclopentyl, octyl, cyclooctyl, cyclononyl, cyclodecyl, norbornyl, isobornyl, adamantyl, adamantylmethylene, tricyclo[5,2,1,0$^{2,6}$] decanemethylene and tetracyclo[4,4,0,1$^{2,5}$,1$^{7,10}$]dodecyl;

R⁵, R⁶ and R⁷ are each independently selected from the group consisting of methyl, ethyl, propyl, isopropyl, n-butyl, sec-butyl, tert-butyl, cyclohexyl, cyclopentyl, octyl, cyclooctyl, cyclononyl, cyclodecyl, norbornyl, isobornyl, adamantyl, adamantylmethylene, tricyclo[5,2,1,0$^{2,6}$]decanemethylene, tetracyclo[4,4,0,1$^{2,5}$,1$^{7,10}$] dodecyl, trifluoromethyl, 2,2,2-trifluoroethyl, pentafluoroethyl, 3,3,3-trifluoropropyl, 1,1,1,3,3,3-hexafluoroisopropyl, 3,3,3,4,4,4-hexafluorobutyl, 3,3,3,4,4,4,5,5,5-nonafluoropentyl, 3,3,3,3,4,4,4,5,5,5,6,6,6-dodecafluorohexyl, 3,3,3,3,4,4,4,5,5,5,6,6,6,7,7,7-pentadecafluoroheptyl, and 3,3,3,3,4,4,4,5,5,5,6,6,6,7,7,7,8,8,8-octadecafluorooctyl;

Structure (II) is selected from the group consisting of trimethylsilyl, ethyl dimethylsilyl, dimethylpropylsilyl, ethylmethylpropylsilyl, diethylpropylsilyl, diethylmethylsilyl, dibutylmethylsilyl, tert-butyidimethylsilyl, tert-butyldiethylsilyl, cyclohexyldimethylsilyl, cyclopentyidimethylsilyl, octyldimethylsilyl, cyclooctyldimethylsilyl, cyclononyldimethylsilyl, cyclodecyldimethylsilyl, norbornyldimethylsilyl, isobornyldimethylsilyl, adamantyldimethylsilyl, adamantylmethylene-dimethylsilyl, 2-(bicyclo[2.2.1]heptyl)dimethylsilyl tricyclo[5,2,1,0$^{2,6}$]decanemethylenedimethylsilyl, tetracyclo[4,4,0,1$^{2,5}$,1$^{7,10}$]dodecyldimethylsilyl dimethyl-3,3,3-trifluoropropylsilyl, dimethyl-1,1,1,3,3,3-hexafluoroisopropylsilyl, dimethyl-3,3,3,4,4,4-hexafluorobutylsilyl, dimethyl-3,3,3,4,4,4,5,5,5-nonafluoropentylsilyl, dimethyl-3,3,3,4,4,4,5,5,5-nonafluoropentylsilyl, dimethyl-3,3,3-trifluoropropyl-silyl, dimethyl-3,3,3,4,4,4,5,5,5,6,6,6-dodecafluoro-hexylsilyl, dimethyl-3,3,3,4,4,4,5,5,5,6,6,6,7,7,7-pentadecafluoroheptylsilyl, and dimethyl-3,3,3,4,4,4,5,5,5,6,6,6,7,7,7,8,8,8-octadecafluorooctylsilyl;

and each R$^2$ substituted alicyclic group is an alicyclic moiety substituted by one or more substituents at any open valence and said substituents on the alicyclic moiety are selected from the group consisting of linear, branched or cyclic alkyl groups, hydroxyl groups, hydroxyalkyl groups of Structure (VII) and ester groups of Structure (VIII)

Structure (VII)

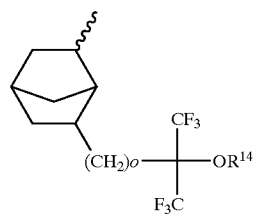

Structure (VIII)

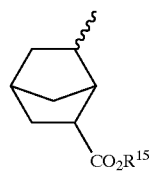

wherein R$^{14}$ is selected from the group consisting of hydrogen, a linear, branched or cyclic alkyl and alicyclic group having 1 to 20 carbon atoms and o is an integer about 1 to 10; R$^{15}$ is selected from the group consisting of hydrogen, a linear, branched or cyclic alkyl and alicyclic group having 1 to 20 carbon atoms, and an acid labile group.

14. The copolymer of claim 13 wherein R$^{14}$ is selected from the group consisting of methyl, ethyl, propyl, isopropyl, n-butyl, sec-butyl, tert-butyl, cyclohexyl, cyclopentyl, octyl, cyclooctyl, cyclononyl, cyclodecyl, norbornyl, isobornyl, adamantyl, adamantylmethylene, tricyclo[5,2,1,0$^{2,6}$]decanemethylene and tetracyclo[4,4,0,1$^{2,5}$,1$^{7,10}$]dodecyl; and R$^{15}$ is selected from the group consisting of methyl, ethyl, propyl, isopropyl, n-butyl, sec-butyl, tert-butyl, cyclohexyl, cyclopentyl, octyl, cyclooctyl, cyclononyl, cyclodecyl, norbornyl, isobornyl, adamantyl, adamantylmethylene, tricyclo[5,2,1,0$^{2,6}$]decanemethylene, tetracyclo[4,4,0,1$^{2,5}$,1$^{7,10}$]dodecyl and the acid labile protecting group in R$^{15}$ is selected from the group consisting of tert-butyl group, 1,1-dimethylpropyl group, 1-methyl-1-ethylpropyl group, 1,1-diethylpropyl group, 1,1-dimethylbutyl group, 1-methyl-1-ethylbutyl group, 1,1-diethyl butyl group, 1,1-dimethylpentyl group, 1-methyl-1-ethylpentyl group, 1,1-diethylpentyl group, 1,1-dimethylhexyl group, 1-methyl-1-ethylhexyl group, 1,1-diethylhexyl group, 1-methyl-1-cyclopentyl, 1-ethyl-1-cyclopentyl, 1-propyl-1-cyclopentyl, 1-butyl-1-cyclopentyl, 1-methyl-1-cyclohexyl, 1-ethyl-1-cyclohexyl, 1-propyl-1-cyclohexyl, 1-butyl-1-cyclohexyl, 2-methyl-2-adamantyl, 2-ethyl-2-adamantyl, 2-propyl-2-adamantyl, 2-butyl-2-adamantyl, 2-isopropyl-2-adamantyl, 1,1-dimethyl-3-oxobutyl, 1-ethyl-1-methyl-3-oxobutyl, 1-methyl-1-cyclohexyl-3-oxobutyl, 1,1-dimethyl-3-oxopentyl, and tetrahydropyran-2-yl.

15. The copolymer of claim 13 wherein Structure (VII) is selected from the group consisting of 5-bicyclo[2.2.1]heptyl-2-(1,1,1-trifluoro-2-trifluoromethyl)propan-2-ol, 5-bicyclo[2.2.1]heptyl-2-(1,1,1-trifluoro-2-trifluoromethyl)butyl-2-ol, 5-bicyclo[2.2.1]heptyl-2-(1,1,1-trifluoro-2-trifluoromethyl)propyl-2-oxomethyl, 5-bicyclo[2.2.1]heptyl-2-(1,1,1-trifluoro-2-trifluoromethyl)propyl-2-oxoethyl, 5-bicyclo[2.2.1]heptyl-2-(1,1,1-trifluoro-2-trifluoromethyl)propyl-2-oxopropyl, 5-bicyclo[2.2.1]heptyl-2-(1,1,1-trifluoro-2-trifluoromethyl)propyl-2-oxo-n-butyl, 5-bicyclo[2.2.1]heptyl-2-(1,1,1-trifluoro-2-trifluoromethyl)propyl-2-oxo-tertbutyl, 5-bicyclo[2.2.1]heptyl-2-(1,1,1-trifluoro-2-trifluoromethyl)propyl-2-oxocyclohexyl, 5-bicyclo[2.2.1]heptyl-2-(1,1,1-trifluoro-2-trifluoromethyl)propyl-2-oxooctyl, 5-bicyclo[2.2.1]heptyl-2-(1,1,1-trifluoro-2-trifluoromethyl)propyl-2-oxocyclooctyl, 5-bicyclo[2.2.1]heptyl-2-(1,1,1-trifluoro-2-trifluoromethyl)propyl-2-oxocyclononyl, 5-bicyclo[2.2.1]heptyl-2-(1,1,1-trifluoro-2-trifluoromethyl)propyl-2-oxocyclodecyl, 5-bicyclo[2.2.1]heptyl-2-(1,1,1-trifluoro-2-trifluoromethyl)propyl-2-oxonorbornyl 1,5-bicyclo[2.2.1]heptyl-2-(1,1,1-trifluoro-2-trifluoromethyl)propyl-2-oxoisobornyl, 5-bicyclo[2.2.1]heptyl-2-(1,1,1-trifluoro-2-trifluoromethyl)propyl-2-oxoadamantyl, 5-bicyclo[2.2.1]heptyl-2-(1,1,1-trifluoro-2-trifluoromethyl)propyl-2-oxo adamantylmethylene, 5-bicyclo[2.2.1]heptyl-2-(1,1,1-trifluoro-2-trifluoromethyl)propyl-2-oxotricyclo[5,2,1,0$^{2,6}$]decanemethylene, bicyclo[2.2.1]heptyl-2-(1,1,1-trifluoro-2-trifluoromethyl)propyl-2-oxo and tetracyclo[4,4,0,1$^{2,5}$,1$^{7,10}$]dodecyl; and Structure (VII) is selected from the group consisting of 5-bicyclo[2.2.1]heptyl-2-(1,1,1-trifluoro-2-trifluoromethyl)propan-2-ol, 5-bicyclo[2.2.1]heptyl-2-(1,1,1-trifluoro-2-trifluoromethyl)butyl-2-ol, 5-bicyclo[2.2.1]heptyl-2-(1,1,1-trifluoro-2-trifluoromethyl)propyl-2-oxomethyl, 5-bicyclo[2.2.1]heptyl-2-(1,1,1-trifluoro-2-trifluoromethyl)propyl-2-oxoethyl, 5-bicyclo[2.2.1]heptyl-2-(1,1,1-trifluoro-2-trifluoromethyl)propyl-2-oxopropyl, 5-bicyclo[2.2.1]heptyl-2-(1,1,1-trifluoro-2-trifluoromethyl)propyl-2-oxo-n-butyl, 5-bicyclo[2.2.1]heptyl-2-(1,1,1-trifluoro-2-trifluoromethyl)propyl-2-oxo-tertbutyl, 5-bicyclo[2.2.1]heptyl-2-(1,1,1-trifluoro-2-trifluoromethyl)propyl-2-oxocyclohexyl, 5-bicyclo[2.2.1]heptyl-2-(1,1,1-trifluoro-2-trifluoromethyl)propyl-2-oxooctyl, 5-bicyclo[2.2.1]heptyl-2-(1,1,1-trifluoro-2-trifluoromethyl)propyl-2-oxocyclooctyl, 5-bicyclo[2.2.1]heptyl-2-(1,1,1-trifluoro-2-trifluoromethyl)propyl-2-oxocyclononyl, 5-bicyclo[2.2.1]heptyl-2-(1,1,1-trifluoro-2-trifluoromethyl)propyl-2-oxocyclodecyl, 5-bicyclo[2.2.1]heptyl-2-(1,1,1-trifluoro-2-trifluoromethyl)propyl-2-oxonorbornyl 1,5-bicyclo[2.2.1]heptyl-2-(1,1,1-trifluoro-2-trifluoromethyl)propyl-2-oxoisobornyl, 5-bicyclo[2.2.1]heptyl-2-(1,1,1-trifluoro-2-trifluoromethyl)propyl-2-oxoadamantyl, 5-bicyclo[2.2.1]heptyl-2-(1,1,1-trifluoro-2-trifluoromethyl)propyl-2-oxoadamantylmethylene, 5-bicyclo[2.2.1]heptyl-2-(1,1,1-trifluoro-2-trifluoromethyl)propyl-2-oxotricyclo[5,2,1,0$^{2,6}$]decanemethylene, bicyclo[2.2.1]heptyl-2-(1,1,1-trifluoro-2-trifluoromethyl)propyl-2-oxo and tetracyclo[4,4,0,1$^{2,5}$,1$^{7,10}$]dodecyl; and Structure (VIII) is selected from the group consisting of 5-(methoxycarbonyl-2-bicyclo[2.2.1]heptyl), 5-(ethoxycarbonyl-2-bicyclo[2.2.1]heptyl), 5-(propyloxycarbonyl-2-bicyclo[2.2.1]heptyl), 5-(n-butoxy carbonyl-2-bicyclo[2.2.1]heptyl), 5-(sec-butoxycarbonyl-2-bicyclo[2.2.1]heptyl), 5-(tert-butoxycarbonyl-2-bicyclo[2.2.1]heptyl), 5-(cyclohexyloxycarbonyl-2-bicyclo[2.2.1]heptyl), 5-(cyclopentyloxycarbonyl-2-bicyclo[2.2.1]heptyl), 5-(octyloxycarbonyl-2-bicyclo[2.2.1]heptyl), 5-(cyclooctyloxycarbonyl-2-bicyclo[2.2.1]heptyl), 5-(cyclononyloxycarbonyl-2-bicyclo[2.2.1]heptyl), 5-(cyclodecyloxycarbonyl-2-bicyclo[2.2.1]heptyl), 5-(norbornyloxycarbonyl-2-bicyclo[2.2.1]heptyl), 5-(isobornyloxycarbonyl-2-bicyclo[2.2.1]heptyl), 5-(adamantyloxycarbonyl-2-bicyclo[2.2.1]heptyl), 5-(adamantylmethyleneloxycarbonyl-2-bicyclo[2.2.1]heptyl), 5-(tricyclo[5,2,1,0$^{2,6}$]decanemethyleneloxycarbonyl-2-bicyclo[2.2.1]heptyl), 5-(tetracyclo[4,4,0,1$^{2,5}$,1$^{7,10}$]dodecyloxycarbonyl-2-bicyclo[2.2.1]heptyl), 5-(1,1-dimethylpropyloxycarbonyl-2-bicyclo[2.2.1]heptyl), 5-(1-methyl-1-ethylpropyloxycarbonyl-2-bicyclo[2.2.1]heptyl), 5-(1,1-diethylpropyloxycarbonyl-2-bicyclo[2.2.1]heptyl), 5-(1,1-dimethylbutyloxycarbonyl-2-bicyclo[2.2.1]heptyl), 5-(1-methyl-1-ethylbutyloxycarbonyl-2-bicyclo[2.2.1]heptyl), 5-(1,1-diethyl butyloxycarbonyl-2-bicyclo[2.2.1]heptyl), 5-(1,1-dimethylpentyloxycarbonyl-2-bicyclo[2.2.1]heptyl), 5-(1-methyl-1-ethylpentyloxycarbonyl-2-bicyclo[2.2.1]heptyl), 5-(1,1-diethylpentyloxycarbonyl-2-bicyclo[2.2.1]heptyl), 5-(1,1-dimethylhexyloxycarbonyl-2-bicyclo[2.2.1]heptyl), 5-(1-methyl-1-ethylhexyloxycarbonyl-2-bicyclo[2.2.1]heptyl), 5-(1,1-diethylhexyloxycarbonyl-2-bicyclo[2.2.1]heptyl), 5-(1-methyl-1-cyclohexyloxy oxycarbonyl-2-bicyclo[2.2.1]heptyl), 5-(1-ethyl-1-cyclohexyloxycarbonyl-2-bicyclo[2.2.1]heptyl), 5-(1-propyl-1-cyclohexyloxycarbonyl-2-bicyclo[2.2.1]heptyl), 5-(1-butyl-1-cyclohexyloxycarbonyl-2-bicyclo[2.2.1]heptyl), 5-(2-methyl-2-adamantyl oxycarbonyl-2-bicyclo[2.2.1]heptyl), 5-(2-ethyl-2-adamantyloxycarbonyl-2-bicyclo[2.2.1]heptyl), 5-(2-propyl-2-adamantyloxycarbonyl-2-bicyclo[2.2.1]heptyl), 5-(2-butyl-2-adamantyloxycarbonyl-2-bicyclo[2.2.1]heptyl), 5-(2-isopropyl-2-adamantyl oxycarbonyl-2-bicyclo[2.2.1]heptyl), 5-(1,1-dimethyl-3-oxobutyloxycarbonyl-2-bicyclo[2.2.1]heptyl), 5-(1-ethyl-1-methyl-3-oxobutyloxycarbonyl-2-bicyclo[2.2.1]heptyl), 5-(1-methyl-1-cyclohexyl-3-oxobutyloxycarbonyl-2-bicyclo[2.2.1]heptyl), 5-(1,1-dimethyl-3-oxopentyloxycarbonyl-2-bicyclo[2.2.1]heptyl), 5-(tetrahydropyran-2-yloxycarbonyl-2-bicyclo[2.2.1]heptyl).

16. The copolymer of claim 1 wherein when $R^2$ is a polar group $(CH_2)_n$—O—(C=O)$R^3$, the polar group is selected from the group consisting of acetyloxyethyl, acetyloxypropyl, acetyloxybutyl, acetyloxypentyl, acetyloxyhexyl, acetyloxyheptyl, acetyloxyoctyl, ethylcarbonyloxyethyl, ethylcarbonyloxypropyl, ethylcarbonyloxybutyl, and propylcarbonyloxyethy;

when $R^2$ is a linear, branched or cyclic fluoroalkyl or fluoro substituted alicyclic group having 1 to 20 carbon atoms $R^2$ is selected from the group consisting of trifluoromethyl, difluoromethyl, 2,2,2-trifluoroethyl, pentafluoroethyl, 3,3,3-trifluoropropyl, 1,1,1,3,3,3-hexafluoroisopropyl, 3,3,3,4,4,4-hexafluorobutyl, 3,3,3,4,4,4,5,5,5-nonafluoropentyl, 3,3,3,4,4,4,5,5,5,6,6,6-dodecafluorohexyl, 3,3,3,4,4,4,5,5,5,6,6,6,7,7,7-pentadedecafluoroheptyl, 3,3,3,4,4,4,5,5,5,6,6,6,7,7,7,8,8,8-octadecafluorooctyl,1,2,2,3,3,4,4,5-octafluorocyclopentyl and 2-(octafluoro-1-trifluoromethylcyclopentyl)ethyl;

when $R^2$ is a polar group $(CH_2)_n$—$OR^8$, the polar group is selected from the group consisting of ethyl-1-oxomethyl, ethyl-1-oxoethyl, ethyl-1-oxopropyl, ethyl-1-oxoisopropyl, ethyl-1-oxo-n-butyl, ethyl-1-oxo-sec-butyl, ethyl-1-oxo-tert-butyl, ethyl-1-oxo-cyclohexyl, ethyl-1-oxo-cyclopentyl, ethyl-1-oxocycloheptyl, ethyl-1-oxooctyl, ethyl-1-oxocyclooctyl, ethyl-1-oxocyclononyl, ethyl-1-oxocyclodecyl, ethyl-1-oxonorbornyl, ethyl-1-oxoisobornyl, ethyl-1-oxoadamantyl, ethyl-1-oxoadamantylmethylene, ethyl-1-oxotricyclo[5,2,1,0$^{2,6}$]decanemethylene, ethyl-1-oxotetracyclo[4,4,0,1$^{2,5}$,1$^{7,10}$]dodecyl, propyl-1-oxomethyl, propyl-1-oxoethyl, butyl-1-oxomethyl, penyl-1-oxomethyl, hexyl-1-oxomethyl, heptyl-1-oxomethyl, octyl-1-oxomethyl, nonanyl-1-oxomethyl, decyl-1-oxomethyl, ethyl-1-oxo-α-methoxymethyl, and ethyl-1-oxo-α-methoxyethyl;

when $R^2$ is a polar group $(CH_2)_n$—(C=O)—$OR^9$, the polar group is selected from the group consisting of tert-butyloxycarbonylethyl, tert-butyloxycarbonylpropyl, tert-butyloxycarbonylbutyl, tert-butyloxycarbonylpentyl, tert-butyloxycarbonylhexyl, tert-butyloxycarbonylheptyl, tert-butyloxycarbonyloctyl, 1,1-dimethylpropyloxycarbonylethyl, 1-methyl-1-ethylpropyloxycarbonylethyl, 1,1-diethylpropyloxycarbonylethyl, 1,1-dimethylbutyloxycarbonylethyl, 1-methyl-1-ethylbutyloxycarbonylethyl, 1,1-diethyl butyloxycarbonylethyl, 1,1-dimethylpentyloxycarbonylethyl, 1-methyl-1-ethylpentyloxycarbonylethyl, 1,1-diethylpentyloxycarbonylethyl, 1,1-dimethylhexyloxycarbonylethyl, 1-methyl-1-ethylhexyloxycarbonylethyl, 1,1-diethylhexyloxycarbonylethyl and the like, 1-methyl-1-cyclohexyloxycarbonylethyl, 1-ethyl-1-cyclohexyloxycarbonylethyl, 1-propyl-1-cyclohexyloxycarbonylethyl, 1-butyl-1-cyclohexyloxycarbonylethyl, 2-methyl-2-adamantyloxycarbonylethyl, 2-ethyl-2-adamantyloxycarbonylethyl, 2-propyl-2-adamantyloxycarbonylethyl, 2-butyl-2-adamanteyloxycarbonylethyl, and 2-isopropyl-2-adamantyloxycarbonylethyl and 1,1-dimethyl-3-oxobutyl, 1-ethyl-1-methyl-3-oxobutyl, 1-methyl-1-cyclohexyl-3-oxobutyloxycarbonylethyl, 1,1-dimethyl-3-oxopentyloxycarbonylethyl, and tetrahydropyran-2-yloxycarbonylethyl; and when R² is a polar group (CH₂)ₙ—C(CF₃)R¹⁰—OR¹¹, the polar group is selected from the group consisting of (1,1,1-trifluoro-2-fluormethyl)butyloxy, (1,1,1-trifluoro-2-fluormethyl)butyloxymethyl, (1,1,1-trifluoro-2-fluormethyl)butyloxyethyl, (1,1,1-trifluoro-2-fluormethyl)butyloxypropyl, (1,1,1-trifluoro-2-fluormethyl)butyloxybutyl, (1,1,1-trifluoro-2-fluormethyl)pentyloxymethyl, (1,1,1-trifluoro-2-fluormethyl)hexyloxymethyl, (1,1,1-trifluoro-2-fluormethyl)heptaloxymethyl, (1,1,1-trifluoro-2-fluormethyl)octaloxymethyl, (1,1,1-trifluoro-2-difluormethyl)butyloxymethyl, (1,1,1-trifluoro-2-difluormethyl)pentaloxymethyl, (1,1,1-trifluoro-2-difluormethyl)hexaloxymethyl, (1,1,1-trifluoro-2-difluormethyl)heptaloxy, (1,1,1-trifluoro-2-trifluormethyl)butyloxymethyl, (1,1,1-trifluoro-2-trifluormethyl)pentaloxymethyl, (1,1,1-trifluoro-2-trifluormethyl)hexaloxymethyl, and (1,1,1-trifluoro-2-trifluormethyl)heptaloxymethyl.

17. The copolymer of claim 1 wherein the monomer generating the repeating unit Structure (IA) after polymerization, is a monomer selected from the group consisting of 3-(3,5,7,9,11,13,15-heptaethylpentacyclo[9.5.1.1³,⁹.1⁵,⁵.1⁷,¹³]octa-siloxan-1-yl)propyl acrylate, 3-(3,5,7,9,11,13,15-heptaethylpentacyclo[9.5.1.1³,⁹.1⁵,¹⁵.1⁷,¹³]octa-siloxan-1-yl) propyl methacrylate, 3-(3,5,7,9,11,13,15-heptamethylpentacyclo[9.5.1.1³,⁹⁰.1⁵,¹⁵⁰.1⁷,¹³]octa-siloxan-1-yl)propyl methacrylate, 3-(3,5,7,9,11,13,15-heptapropylpentacyclo[9.5.1.1³,⁹.1⁵,¹⁵.1⁷,¹³]octa-siloxan-1-yl)propyl methacrylate, 3-(3,5,7,9,11,13,15-heptaisobutylpentacyclo[9.5.1.1³,⁹.1⁵,¹⁵.1⁷,¹³]octa-siloxan-1-yl)propyl methacrylate, 3-(3,5,7,9,11,13,15-hepta-tert-butylpentacyclo[9.5.1.1³,⁹.1⁵,¹⁵.1⁷,¹³]octa-siloxan-1-yl) propyl methacrylate, 3-(3,5,7,9,11,13,15-heptacyclopentylpentacyclo[9.5.11³,⁹.1⁵,¹⁵.1⁷,¹³]octa-siloxan-1-yl)propyl methacrylate, 3-(3,5,7,9,11,13,15-heptacyclohexylpentacyclo[9.5.1.1³,⁹.1⁵,¹⁵.1⁷,¹³]octa-siloxan-1-yl) proply methacrylate, 3-(3,5,7,9,11,13,15-heptaethylpentacyclo[9.5.1.1³,⁹.1⁵,¹⁵.1⁷,¹³]octa-siloxan-1-yl) butyl methacrylate, 3-(3,5,7,9,11,13,15-heptaethylpentacyclo[9.5.1.1³,⁹.1⁵,¹⁵.1⁷,¹³]octa-siloxan-1-yl)pentyl methacrylate, 3-(3,5,7,9,11,13,15-heptaethylpentacyclo[9.5.1.1³,⁹.1⁵,¹⁵.1⁷,¹³]octa-siloxan-1-yl)hexyl methacrylate, 3-(3,5,7,9,11,13,15-heptakis(3,3,3,4,4,4,5,5,5,6,6,6,7,7,7,8,8,8-octadecafluorooctyl)pentacyclo[9.5.1.13.9.15,15.1⁷,¹³]octa-siloxan-1-yl)propyl methacrylate, 3-(3,5,7,9,11,13,15-heptakis{5-bicyclo[2.2.1]heptyl-2-(1,1,1-trifluoro-2-trifluoromethyl)propyl-2-oxomethyl)}pentacyclo[9.5.1.1³,⁹.1⁵,¹⁵.1⁷,¹³]octa-siloxan-1-yl)propyl methacrylate, 3-(3,5,7,9,11,13,15-heptakis(tert-butyl)pentacyclo[9.5.1.1³,⁹.1⁵,¹⁵.1⁷,¹³]octa-siloxan-1-yl) propyl methacrylate;

the monomer generating the repeating unit of Structure (IB) after polymerization is a monomer selected from the group consisting of 3-(13-hydroxy-1,3,5,9,11,13,15-heptamethyl-7-methyltetracyclo[9.5.1.1³,⁹.1⁵,¹⁵]octa-siloxan-7-yl)propyl acrylate, 3-(13-hydroxy-1,3,5,9,11,13,15-heptaethyl-7-methyltetracyclo[9.5.1.1³,⁹.1⁵,¹⁵]octa-siloxan-7-yl)propyl methacrylate, 3-(13-hydroxy-1,3,5,9,11,13,15-heptamethyl-7-methyltetracyclo[9.5.1.1³,⁹.1⁵,¹⁵]octa-siloxan-7-yl) butyl acrylate, 3-(13-hydroxy-1,3,5,9,11,13,15-heptamethyl-7-ethyltetracyclo[9.5.1.1³,⁹.1⁵,¹⁵]octa-siloxan-7-yl)propyl acrylate, 3-(13-trimethylsiloxy-1,3,5,9,11,13,15-heptamethyl-7-methyltetracyclo[9.5.1.1³,⁹.1⁵,¹⁵]octa-siloxan-7-yl)propyl acrylate, 3-(13-triethylsiloxy-1,3,5,9,11,13,15-heptamethyl-7-methyltetracyclo[9.5.1.1³,⁹.1⁵,¹⁵]octa-siloxan-7-yl) propyl acrylate, 3-(13-trimethylsiloxy-1,3,5,9,11,13,15-heptamethyl-7-methyltetracyclo[9.5.1.1³,⁹.1⁵,¹⁵] octa-siloxan-7-yl)propyl methacrylate, 3-(13-trimethylsiloxy-1,3,5,9,11,13,15-heptaethyl-7-methyltetracyclo[9.5.1.1³,⁹.1⁵,¹⁵]octa-siloxan-7-yl) propyl methacrylate, 3-(13-trimethylsiloxy-1,3,5,9,11,13,15-heptacyclopentyl-7-methyltetracyclo[9.5.1.1³,⁹.1⁵,¹⁵]octa-siloxan-7-yl)propyl methacrylate, 3-(13-trimethylsiloxy-1,3,5,9,11,13,15-heptaisobutyl-7-methyltetracyclo[9.5.1.1³,⁹.1⁵,¹⁵]octa-siloxan-7-yl) propyl methacrylate, 3-(13-trimethylsiloxy-1,3,5,9,11,13,15-heptacycloheptyl-7-methyltetracyclo[9.5.1.1³,⁹.1⁵,¹⁵]octa-siloxan-7-yl)propyl methacrylate, 3-(13-tert-butyldimethylsiloxy-1,3,5,9,11,13,15-heptacycloheptyl-7-methyltetracyclo[9.5.1.1³,⁹.1⁵,¹⁵]octa-siloxan-7-yl)propyl methacrylate, 3-(13-dimethyl-1,1,1-trifluoropropylsiloxy-1,3,5,9,11,13,15-heptacycloheptyl-7-methyltetracyclo[9.5.1.1³,⁹.1⁵,¹⁵] octa-siloxan-7-yl)propyl methacrylate, 3-(13-dimethyl-3,3,3,4,4,4,5,5,5,6,6,6,7,7,7,8,8,8-octadecafluorooctyl-siloxy-1,3,5,9,11,13,15-heptacycloheptyl-7-methyltetracyclo[9.5.1.1³,⁹.1⁵,¹⁵]octasiloxan-7-yl) propyl methacrylate;

the monomer generating the repeating unit of Structure (IC) after polymerization is a monomer selected from the group consisting of 3-[(7,14-dihydroxy-1,3,5,7,9,11,14-heptamethyltricyclo[7.3.3.1⁵,¹¹]heptasiloxan-3-yloxy)dimethylsilyl]propyl acrylate, 3-[(7,14-dihydroxy-1,3,5,7,9,11,14-heptamethyltricyclo[7.3.3.1⁵,¹¹]heptasiloxan-3-yloxyidimethylsilyl]propyl methacrylate, -[(7,14-dihydroxy-1,3,5,7,9,11,14-heptaethyltricyclo[7.3.3.1⁵,¹¹]heptasiloxan-3-yloxy)dimethylsilyl]propyl methacrylate, 3-[(7,14-dihydroxy-1,3,5,7,9,11,14-heptaisobutyltricyclo[7.3.3.1⁵,¹¹]heptasiloxan-3-yloxy)dimethylsilyl]propyl methacrylate, 3-[(7,14-dihydroxy-1,3,5,7,9,11,14-heptacyclopentyltricyclo[7.3.3.1⁵,¹¹]heptasiloxan-3-yloxy)dimethylsilyl]propyl methacrylate, 3-[(7,14-dihydroxy-1,3,5,7,9,11,14-heptacyclopentyltricyclo[7.3.3.1⁵,¹¹]heptasiloxan-3-yloxy)dimethylsilyl]propyl methacrylate, 3-[(7,14-dihydroxy-1,3,5,7,9,11,14-heptamethyltricyclo[7.3.3.1⁵,¹¹]heptasiloxan-3-yloxy)dimethylsilyl]butyl acrylate, 3-[(7,14-di(trimethylsiloxy)-1,3,5,7,9,11,14-heptamethyltricyclo[7.3.3.1⁵,¹¹]heptasiloxan-3-yloxy)dimethylsilyl]propyl acrylate.

18. The copolymer of claim 1 wherein the R¹² in the repeating unit of Structure (III) is an acid labile group selected from the group consisting of tert-butyl group, 1,1-dimethylpropyl group, 1-methyl-1-ethylpropyl group, 1,1-diethylpropyl group, 1,1-dimethylbutyl group, 1-methyl-1-ethylbutyl group, 1,1-diethyl butyl group, 1,1-dimethylpentyl group, 1-methyl-1-ethylpentyl group, 1,1-diethylpentyl group, 1,1-dimethylhexyl group, 1-methyl-1-ethylhexyl group, 1,1-diethylhexyl group and the like, 1-methyl-1-cyclopentyl, 1-ethyl-1-cyclopentyl, 1-propyl-1-cyclopentyl, 1-butyl-1-cyclopentyl, 1-methyl-1-cyclohexyl, 1-ethyl-1-cyclohexyl, 1-propyl-1-cyclohexyl, 1-butyl-1-cyclohexyl, 2-methyl-2-adamantyl, 2-ethyl-2-adamantyl, 2-propyl-2-adamantyl, 2-butyl-2-adamanteyl, and 2-isopropyl-2-adamantyl and 1,1-dimethyl-3-oxobutyl, 1-methyl-1-methyl-3-oxobutyl, 1-methyl-1-cyclohexyl-3-oxobutyl, 1,1-dimethyl-3-oxopentyl, and tetrahydropyran-2-yl; and the monomer generating the repeating unit of Structure (VI) after polymerization is a monomer selected from the group consisting of maleic anhydride, citraconic anhydride and 2,3-dimethylmaleic anhydride.

19. A copolymer of claim 1 comprising repeating units of Structures (I), (III) and (IV) and additionally comprising a repeating unit having an unprotected alkali solubilizing moiety.

20. A copolymer of claim 19 wherein the repeating unit having unprotected alkali solubilizing units has alkali solubilizing units selected from the group consisting of phenolic, groups, carboxylic acids and fluorinated alcohols.

21. A copolymer of claim 20 wherein the repeating unit having an unprotected alkali solubilizing moiety is a repeating unit from hydroxystyrene, hydroxystyrene precursors, acrylic acid, methacrylic acid and 4-[2-1,1,1,3,3,3-hexafluoro-2-hydroxy)-propyl]styrene.

22. A photosensitive composition comprising:
(a) a copolymer of claim 1;
(b) a photoacid generator;
(c) a solvent; and.
(d) optionally a base.

23. A photosensitive composition comprising:
a. a copolymer of claim 2;
b. a photoacid generator; and
c. a solvent; and
d. optionally a base.

24. A photosensitive composition comprising:
a. a copolymer of claim 3;
b. a photoacid generator;
c. a solvent; and
d. optionally a base.

25. A photosensitive composition comprising:
e. a copolymer of claim 4;
f. a photoacid generator;
g. a solvent; and
h. optionally a base.

26. A photosensitive composition comprising:
a. a copolymer of claim 5;
b. a photoacid generator;
c. a solvent; and
d. optionally a base.

27. A photosensitive composition comprising:
a. a copolymer of claim 6;
b. a photoacid generator;
c. a solvent; and
d. optionally a base.

28. A photosensitive composition comprising:
a. a copolymer of claim 7;
b. a photoacid generator;
c. a solven; and
d. optionally a base.

29. A photosensitive composition comprising:
a. a copolymer of claim 8;
b. a hotoacid generator;
c. a solvent; and
d. optionally a base.

30. A photosensitive composition comprising:
a. a copolymer of claim 9;
b. a photoacid generator;
c. a solvent; and
d. optionally a base.

31. A photosensitive composition comprising:
a. a copolymer of claim 10;
b. a photoacid generator;
c. a solvent; and
d. optionally a base.

32. A photosensitive composition comprising:
a. a copolymer of claim 11;
b. a photoacid generator;
c. a solvent and
d. optionally a base.

33. A photosensitive composition comprising:
a. a copolymer of claim 12;
b. a photoacid generator;
c. a solvent; and
d. optionally a base.

34. A photosensitive composition comprising:
a. a copolymer of claim 13;
b. a photoacid generator;
c. a solvent; and
d. optionally a base.

35. A photosensitive composition comprising:
a. a copolymer of claim 14;
b. a photoacid generator;
c. a solvent; and
d. optionally a base.

36. A photosensitive composition comprising:
a. a copolymer of claim 15;
b. a photoacid generator;
c. a solvent; and
d. optionally a base.

37. A photosensitive composition comprising:
a. a copolymer of claim 16;
b. a photoacid generator;
c. a solvent; and
d. optionally a base.

38. A photosensitive composition comprising:
a. a copolymer of claim 17;
b. a photoacid generator;
c. a solvent; and
d. optionally a base.

39. A photosensitive composition comprising:
a. a copolymer of claim 18;
b. a photoacid generator;
c. a solvent; and
d. optionally a base.

40. A photosensitive composition comprising:
a. a copolymer of claim 19;
b. a photoacid generator;
c. a solvent; and
d. optionally a base.

41. A photosensitive composition comprising:
a. a copolymer of claim 20;
b. a photoacid generator;
c. a solvent; and
d. optionally a base.

42. A photosensitive composition comprising:
a. a copolymer of claim 21;
b. a photoacid generator;

c. a solvent; and d. optionally a base.

43. A photosensitive composition of claim 22 wherein the optional base is present and is selected from the group consisting of 2-methylimidazole, triisopropylamine, 4-dimethylaminopryidine, 4,4'-diaminodiphenyl ether, 2,4,5 triphenyl imidazole and 1,5-diazobicyclo[4.3.0]non-5-ene.

44. A process for producing a patterned image on a substrate, the process comprising the steps of:

a. coating on a suitable undercoated substrate a photosensitive composition of claim 22, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

45. A process for producing a patterned image on a substrate, the process comprising the steps of:

a. coating on a suitable undercoated photosensitive composition of claim 23, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

46. A process for producing a patterned image on a substrate, the process comprising the steps of:

a. coating on a suitable undercoated photosensitive composition of claim 24, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosensitive composition.

47. A process for producing a patterned image on a substrate, the process comprising the steps of:

a. coating on a suitable undercoated substrate a photosensitive composition of claim 25 thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

48. A process for producing a patterned image on a substrate, the process comprising the steps of:

a. coating on a suitable undercoated substrate a photosensitive composition of claim 26, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

49. A process for producing a patterned image on a substrate, the process comprising the steps of:

a. coating on a suitable undercoated substrate a photosensitive composition of claim 27 thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

50. A process for producing a patterned image on a substrate, the process comprising the steps of:

a. coating on a suitable undercoated substrate a photosensitive composition of claim 28, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

51. A process for producing a patterned image on a substrate, the process comprising the steps of:

a. coating on a suitable undercoated substrate a photosensitive composition of claim 29, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

52. A process for producing a patterned image on a substrate, the process comprising the steps of:

a. coating on a suitable undercoated substrate a photosensitive composition of claim 30, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

53. A process for producing a patterned image on a substrate, the process comprising the steps of:

a. coating on a suitable undercoated substrate a photosensitive composition of claim 31, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and g. removing the undercoat in an area unprotected by the photosentitive composition.

54. A process for producing a patterned image on a substrate, the process comprising the steps of:

a. coating on a suitable undercoated substrate a photosensitive composition of claim 32, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

55. A process for producing a patterned image on a substrate, the process comprising the steps of:

a. coating on a suitable undercoated substrate a photosensitive composition of claim 33, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

56. A process for producing a patterned image on a substrate, the process comprising the steps of:

a. coating on a suitable undercoated substrate a photosensitive composition of claim 34, thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

57. A process for producing a patterned image on a substrate, the process comprising the steps of:

a. coating on a suitable undercoated photosensitive composition of claim 35 thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

58. A process for producing a patterned image on a substrate, the process comprising the steps of:

a. coating on a suitable undercoated substrate a photosensitive composition of claim 36 thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and g. removing the undercoat in an area unprotected by the photosentitive composition.

59. A process for producing a patterned image on a substrate, the process comprising the steps of:

a. coating on a suitable undercoated substrate a photosensitive composition of claim 37 thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

60. A process for producing a patterned image on a substrate, the process comprising the steps of:

a. coating on a suitable undercoated substrate a photosensitive composition of claim 38 thereby forming a coated substrate;

b. prebaking the coated substrate;

c. exposing the prebaked coated substrate to actinic radiation;

d. optionally post-baking the exposed coated substrate;

e. developing the exposed coated substrate with a developer thereby forming an uncured relief image on the coated substrate; and f. removing the undercoat in an area unprotected by the photosentitive composition.

61. A process for producing a patterned image on a substrate, the process comprising the steps of:
   a. coating on a suitable undercoated substrate a photosensitive composition of claim 39 thereby forming a coated substrate;
   b. prebaking the coated substrate;
   c. exposing the prebaked coated substrate to actinic radiation;
   d. optionally post-baking the exposed coated substrate;
   e. developing the exposed coated substrate with a developer thereby forming an uncured relief image on the coated substrate; and
   f. removing the undercoat in an area unprotected by the photosentitive composition.

62. A process for producing a patterned image on a substrate, the process comprising the steps of:
   a. coating on a suitable undercoated substrate a photosensitive composition of claim 40 thereby forming a coated substrate;
   b. prebaking the coated substrate;
   c. exposing the prebaked coated substrate to actinic radiation;
   d. optionally post-baking the exposed coated substrate;
   e. developing the exposed coated substrate with a developer thereby forming an uncured relief image on the coated substrate; and
   f. removing the undercoat in an area unprotected by the photosentitive composition.

63. A process for producing a patterned image on a substrate, the process comprising the steps of:
   a. coating on a suitable undercoated substrate a photosensitive composition of claim 41 thereby forming a coated substrate;
   b. prebaking the coated substrate;
   c. exposing the prebaked coated substrate to actinic radiation;
   d. optionally post-baking the exposed coated substrate;
   e. developing the exposed coated substrate with a developer thereby forming an uncured relief image on the coated substrate; and
   f. removing the undercoat in an area unprotected by the photosentitive composition.

64. A process for producing a patterned image on a substrate, the process comprising the steps of:
   a. coating on a suitable undercoated substrate a photosensitive composition of claim 42 thereby forming a coated substrate;
   b. prebaking the coated substrate;
   c. exposing the prebaked coated substrate to actinic radiation;
   d. optionally post-baking the exposed coated substrate;
   e. developing the exposed coated substrate with a developer thereby forming an uncured relief image on the coated substrate; and
   f. removing the undercoat in an area unprotected by the photosentitive composition.

65. A process for producing a patterned image on a substrate, the process comprising the steps of:
   a. coating on a suitable substrate a photosensitive composition of claim 22 thereby forming a coated substrate;
   b. prebaking the coated substrate;
   c. exposing the prebaked coated substrate to actinic radiation;
   d. optionally post-baking the exposed coated substrate; and
   e. developing the exposed coated substrate with a developer thereby forming an uncured relief image on the coated substrate.

66. A patterned substrate produced by the process of claim 44.

67. A patterned substrate produced by the process of claim 45.

68. A patterned substrate produced by the process of claim 52.

* * * * *